United States Patent
Muraki et al.

(10) Patent No.: US 6,515,409 B2
(45) Date of Patent: Feb. 4, 2003

(54) CHARGED-PARTICLE BEAM EXPOSURE APPARATUS, EXPOSURE SYSTEM, CONTROL METHOD THEREFOR, AND DEVICE MANUFACTURING METHOD

(75) Inventors: Masato Muraki, Tokyo (JP); Yoshikiyo Yui, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 196 days.

(21) Appl. No.: 09/733,973

(22) Filed: Dec. 12, 2000

(65) Prior Publication Data

US 2001/0004185 A1 Jun. 21, 2001

(30) Foreign Application Priority Data

Dec. 13, 1999 (JP) ........................................... 11-353482

(51) Int. Cl.[7] ................................................. H01J 37/08
(52) U.S. Cl. ................ 313/359.1; 250/398; 250/492.22
(58) Field of Search ...................... 313/359.1; 250/334, 250/398, 492.22, 492.3

(56) References Cited

U.S. PATENT DOCUMENTS

| 5,260,579 | A | * | 11/1993 | Yasuda et al. ............... 250/398 |
| 5,834,783 | A | | 11/1998 | Muraki et al. ............... 250/398 |
| 5,864,142 | A | * | 1/1999 | Muraki et al. ............ 250/491.1 |
| 5,973,332 | A | | 10/1999 | Muraki et al. ............ 250/492.2 |
| 6,274,877 | B1 | * | 8/2001 | Muraki ..................... 250/492.2 |

* cited by examiner

*Primary Examiner*—Don Wong
*Assistant Examiner*—Thuy Vinh Tran
(74) *Attorney, Agent, or Firm*—Fitzpatrick, Cella, Harper & Scinto

(57) ABSTRACT

An element exposure field (EF) having a size falling within a range where aberration by an electron optical system is suppressed to a predetermined amount or less is divided into a plurality of partial fields (PF), and a pattern is drawn on a substrate with an electron beam on the basis of exposure information in which charged-particle beam dosages for the plurality of partial fields are set. Each partial field (PF) is continuously scanned and exposed with a corresponding dosage contained in the exposure information. Scan/exposure for each partial field (PF) is sequentially executed for all the partial fields (PF) in the element exposure field (EF).

22 Claims, 19 Drawing Sheets

SEMICONDUCTOR DEVICE MANUFACTURING FLOW

CHARGED-PARTICLE BEAM EXPOSURE APPARATUS, EXPOSURE SYSTEM, CONTROL METHOD THEREFOR, AND DEVICE MANUFACTURING METHOD

FIELD OF THE INVENTION

The present invention relates to a charged-particle beam exposure apparatus and a control method therefor and, more particularly, to a charged-particle beam exposure apparatus for drawing a pattern on a substrate with a charged particle beam, a control method therefor, a device manufacturing method using the charged-particle beam exposure apparatus controlled by the control method, an exposure system having the charged-particle beam exposure apparatus, and a control method therefor.

BACKGROUND OF THE INVENTION

As charged-particle beam exposure apparatuses, there are, e.g., an electron beam exposure apparatus and ion beam exposure apparatus. The charged-particle beam exposure apparatus is used to draw a desired pattern on a substrate (e.g., a wafer or glass plate) for forming a semiconductor integrated circuit, a mask or reticle for manufacturing a semiconductor integrated circuit, or a display apparatus such as an LCD.

In general, charged-particle beam exposure divides a pattern to be exposed into a plurality of element exposure fields, and draws a pattern by raster scan using charged particles within each element exposure field. The size of the element exposure field is set as large as possible in order to increase the throughput of exposure processing as far as the influence of aberration by the electron optical system of this apparatus is weak.

When a pattern is to be formed on a wafer using a charged particle beam, the apparatus suffers a so-called proximity effect that charged particles irradiating the wafer scatter in a resist and substrate, failing to obtain a designed pattern. Under the influence of the proximity effect, a pattern becomes thinner than a design value on a thin pattern (e.g., an isolated thin pattern) having a low drawing density, and patterns which should be separated are connected to each other on a pattern (e.g., a pattern sandwiched between large patterns) having a high drawing density.

To prevent this, the charged-particle beam exposure apparatus adopts a method of drawing a pattern in each element exposure field while controlling the dosage (dose) so as to exclude the influence of the above-described proximity effect in accordance with a drawing pattern.

According to an example of this method, a pattern is drawn while the dosage per dot is controlled. This method, however, performs dosage setting operation every time one dot is drawn, and the throughput of exposure processing is not practical.

To solve this problem, as shown in FIG. 9, an element exposure field is subdivided into smaller partial fields to set a dose for each partial field. For example, as shown in FIG. 9, an element exposure field is divided into four partial fields 91 to 94, and doses (Dose(1), Dose(2), Dose(3), and Dose (4)) are set for the respective partial fields.

Also in this case, however, the throughput is low. As is apparent from FIG. 9, one scan line lies across two partial fields, so that the dose must be changed (from Dose(1) to Dose(2)) during the first scan, and returned (from Dose(2) to Dose(1)) again at the start of the second scan.

In this manner, even if a dose is to be set for each partial field prepared by subdividing an element exposure field, the dose must be frequently changed, a time required for data transfer to a blanker control circuit for switching the dosage and data setting (set ring) increases, and the throughput of exposure processing greatly decreases.

SUMMARY OF THE INVENTION

The present invention has been made to overcome the conventional drawbacks, and had as its object to provide a charged-particle beam exposure apparatus capable of more effectively excluding an adverse effect caused by the proximity effect while maintaining the throughput of exposure processing, and a control method therefor.

A charged-particle beam exposure apparatus according to one aspect of the present invention for achieving the above object comprises the following arrangement.

That is, a charged-particle beam exposure apparatus for dividing each element exposure field having a size falling within a range where aberration by an electron optical system is suppressed to not more than a predetermined amount into a plurality of partial fields, and drawing a pattern on a substrate with a charged particle beam on the basis of exposure information in which charged-particle beam dosages for the plurality of partial fields are set comprises scan/exposure means for continuously scanning and exposing an entire corresponding partial field with the dosage contained in the exposure information, thereby drawing a pattern, and execution means for sequentially executing scan/exposure by the scan/exposure means for all partial fields in the element exposure field, thereby drawing a pattern in the element exposure field.

An exposure system according to another aspect of the present invention for achieving the above object comprises the following arrangement.

That is, an exposure system having a charged-particle beam exposure apparatus for drawing a pattern on a substrate with a charged particle beam on the basis of exposure information comprises determination means for dividing an element exposure field having a size falling within a range where aberration by an electron optical system is suppressed to not more than a predetermined amount into a plurality of partial fields, and determining charged-particle beam dosages for the plurality of partial fields on the basis of a drawing pattern, providing means for providing the charged-particle beam exposure apparatus with exposure information containing the dosages determined by the determination means and the drawing pattern for the respective partial fields, scan/exposure means for continuously scanning and exposing an entire corresponding partial field with the dosage contained in the exposure information, thereby drawing a pattern, and execution means for sequentially executing scan/exposure by the scan/exposure means for all partial fields included in the element exposure field, thereby drawing a pattern in the element exposure field.

A control method for a charged-particle beam exposure apparatus according to still another aspect of the present invention for achieving the above object comprises the following steps.

That is, a control method for a charged-particle beam exposure apparatus for dividing each element exposure field having a size falling within a range where aberration by an electron optical system is suppressed to not more than a predetermined amount into a plurality of partial fields, and drawing a pattern on a substrate with a charged particle beam on the basis of exposure information in which charged-particle beam dosages for the plurality of partial fields are set comprises the scan/exposure step of continuously scanning and exposing an entire corresponding partial field with the dosage contained in the exposure information, thereby drawing a pattern, and the execution step of sequentially executing scan/exposure in the scan/exposure step for all partial fields in the element exposure field, thereby drawing a pattern in the element exposure field.

A control method for a charged-particle beam exposure apparatus according to still another aspect of the present invention for achieving the above object comprises the following steps.

That is, a control method for an exposure system having a charged-particle beam exposure apparatus for drawing a pattern on a substrate with a charged particle beam on the basis of exposure information comprises the determination step of dividing an element exposure field having a size falling within a range where aberration by an electron optical system is suppressed to not more than a predetermined amount into a plurality of partial fields, and determining charged-particle beam dosages for the plurality of partial fields on the basis of a drawing pattern, the providing step of providing the charged-particle beam exposure apparatus with exposure information containing the dosages determined in the determination step and the drawing pattern for the respective partial fields, the scan/exposure step of continuously scanning and exposing an entire corresponding partial field with the dosage contained in the exposure information, thereby drawing a pattern, and the execution step of sequentially executing scan/exposure in the scan/exposure step for all partial fields included in the element exposure field, thereby drawing a pattern in the element exposure field.

The present invention for achieving the above object provides a device manufacturing method including the step of drawing a pattern on a substrate while controlling a charged-particle beam exposure apparatus by the above-described control method.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

The embodiments will explain an electron beam exposure apparatus as an example of the charged-particle beam exposure apparatus. However, the present invention is not limited to an electron beam exposure apparatus, but can also be applied to, e.g., an ion beam exposure apparatus.

Figure 1:
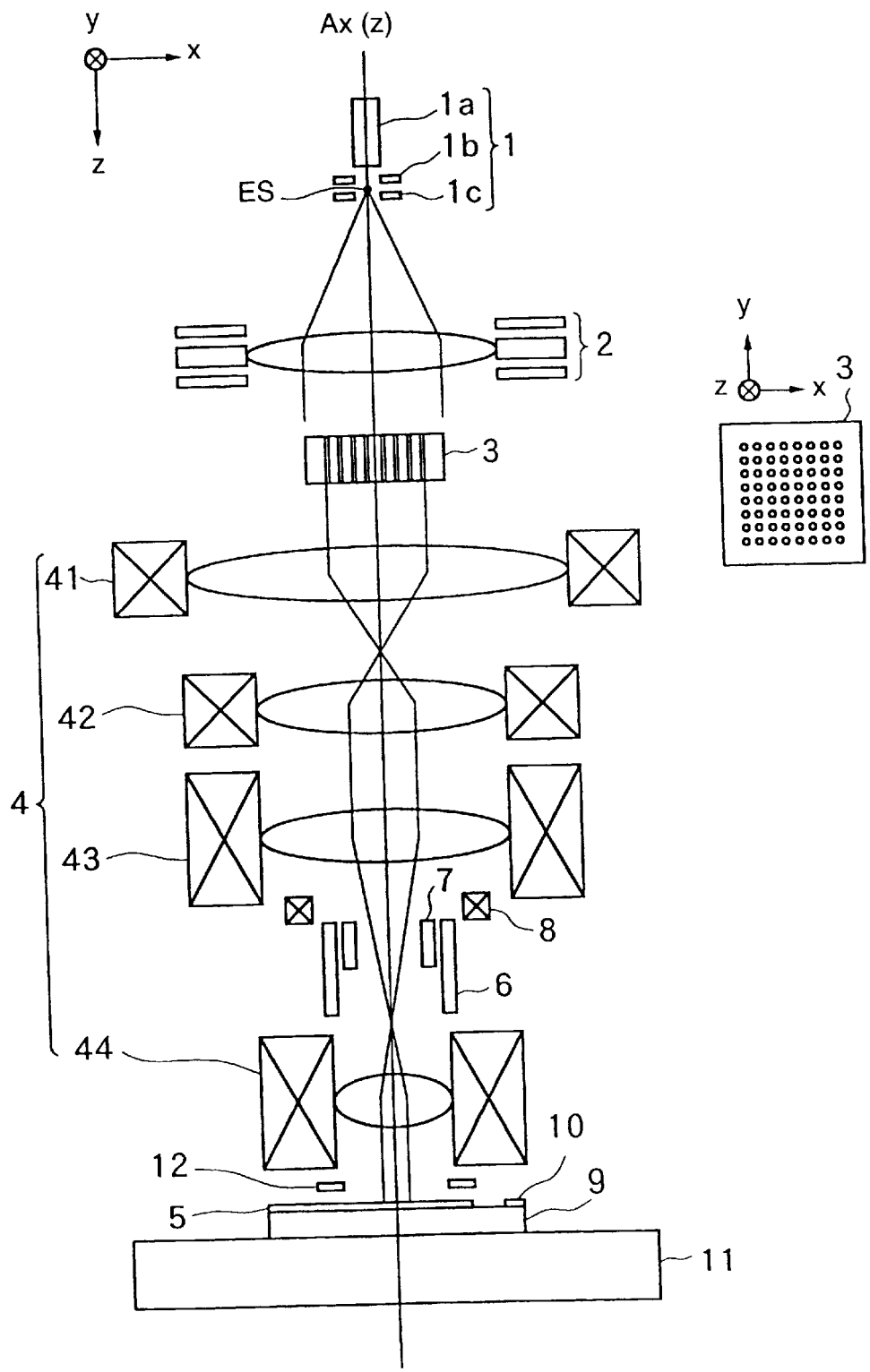
FIG. 1 is a schematic view showing an electron beam exposure apparatus according to a preferred embodiment of the present invention.

FIG. 1 is a schematic view showing an electron beam exposure apparatus according to a preferred embodiment of the present invention. Reference numeral 1 denotes an electron gun including a cathode 1a, grid 1b, and anode 1c. Electrons emitted by the cathode 1a form a crossover image as an electron source ES between the grid 1b and the anode 1c.

Electrons emitted by the electron source ES irradiate an element electron optical system array 3 via a condenser lens 2. The condenser lens 2 is comprised of, e.g., three aperture electrodes.

Figure 2A:
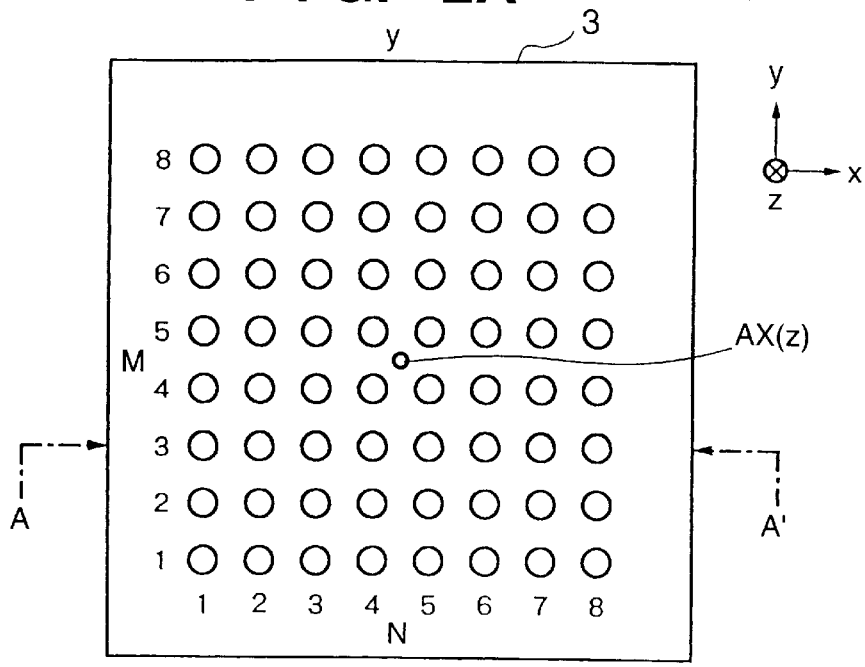
FIGS. 2A and 2B are views showing the detailed arrangement of an element electron optical system array.
Figure 2B:
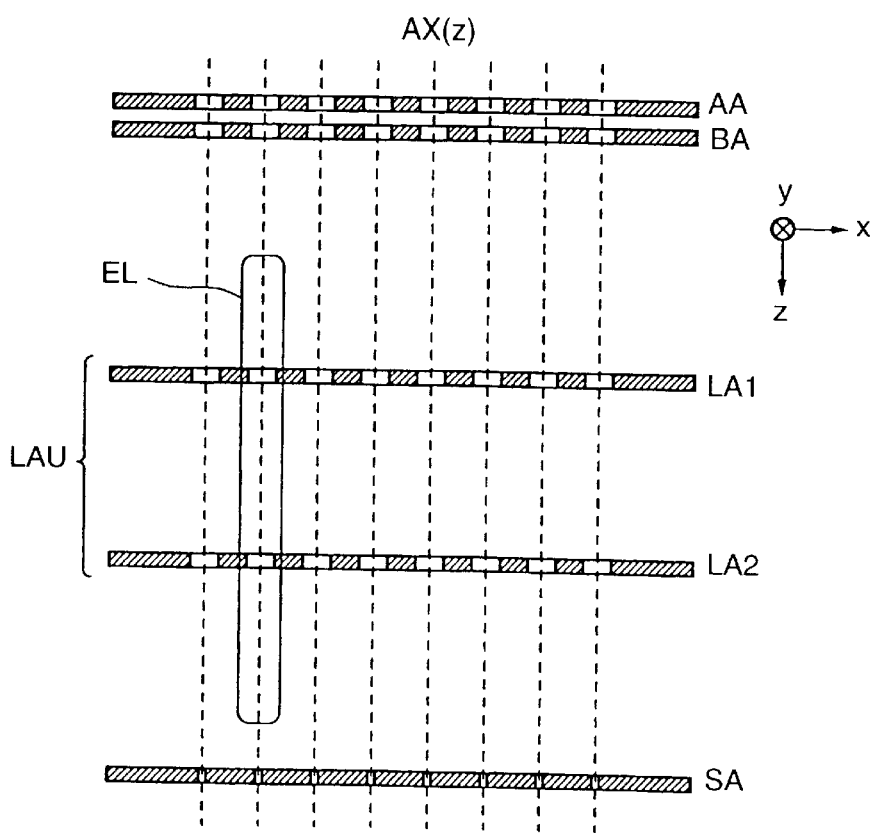

As shown in FIG. 2B, the element electron optical system array 3 is constituted by an aperture array AA, blanker array BA, element electron optical system array unit LAU, and stopper array SA sequentially arranged along an optical axis AX from the electron gun 1 side. Details of the element electron optical system array 3 will be described later.

The element electron optical system array 3 forms a plurality of intermediate images of the electron source ES, and each intermediate image is reduced and projected on a substrate 5 such as a wafer via a reduction electron optical system 4. Accordingly, a plurality of electron source images having the same shape are formed on the substrate 5. The element electron optical system array 3 forms these intermediate images so as to correct aberration generated upon reducing and projecting the intermediate images on the substrate 5 via the reduction electron optical system 4.

The reduction electron optical system 4 is constituted by a symmetrical magnetic doublet made up of a first projection lens 41 and second projection lens 42, and a symmetrical magnetic doublet made up of a first projection lens 43 and second projection lens 44. Letting f1 be the focal length of the first projection lens 41 (43), and f2 be the focal length of the second projection lens 42 (44), the distance between the two lenses is f1+f2.

The object point on the optical axis AX is at the focal position of the first projection lens 41 (43), and the image point is at the focal point of the second projection lens 42 (44). This image is reduced to −f2/f1. Since the magnetic fields of the two lenses are determined to act in opposite directions in an exposure apparatus 100, Seidel aberrations and chromatic aberrations concerning rotation and magnification are theoretically canceled except for five aberrations, i.e., spherical aberration, isotropic astigmatism, isotropic coma, curvature of field, and on-axis chromatic aberration.

Reference numeral 6 denotes a deflector for deflecting a plurality of electron beams from the element electron optical system array 3 and displacing a plurality of electron source images on the substrate 5 by almost the same displacement amount in the X and Y directions. Although not shown, the deflector 6 is comprised of a main deflector used when the scan width is large, and a sub-deflector used when the scan width is small. The main deflector is an electromagnetic deflector, whereas the sub-deflector is an electrostatic deflector.

Reference numeral 7 denotes a dynamic focus coil for correcting a shift in the focal position of an electron source image caused by deflection aberration generated upon operating the deflector 6; and 8, a dynamic stigmatic coil for correcting astigmatism among deflection aberrations generated by deflection.

Reference numeral 9 denotes a θ-Z stage which supports the substrate 5 and is movable in the optical axis AX (Z-axis) direction and the rotational direction around the Z-axis. A stage reference plate 10 is fixed to the θ-Z stage 9.

Reference numeral 11 denotes an X-Y stage which supports the θ-Z stage and is movable in the X and Y directions perpendicular to the optical axis AX (Z-axis).

Reference numeral 12 denotes a reflected-electron detector for detecting reflected electrons generated upon irradiating a mark on the stage reference plate 10 with an electron beam.

The arrangement of the element electron optical system array 3 will be explained with reference to FIGS. 2A and 2B. As described above, the element electron optical system array 3 is constituted by the aperture array AA, blanker array BA, element electron optical system array unit LAU, and stopper array SA. FIG. 2A is a view of the element electron optical system array 3 when viewed from the electron gun 1, and FIG. 2B is a sectional view taken along the line A–A' in FIG. 2A.

As shown in FIG. 2A, the aperture array AA has a plurality of apertures formed in a substrate, and divides an electron beam from the condenser lens 2 into a plurality of electron beams.

Figure 3:
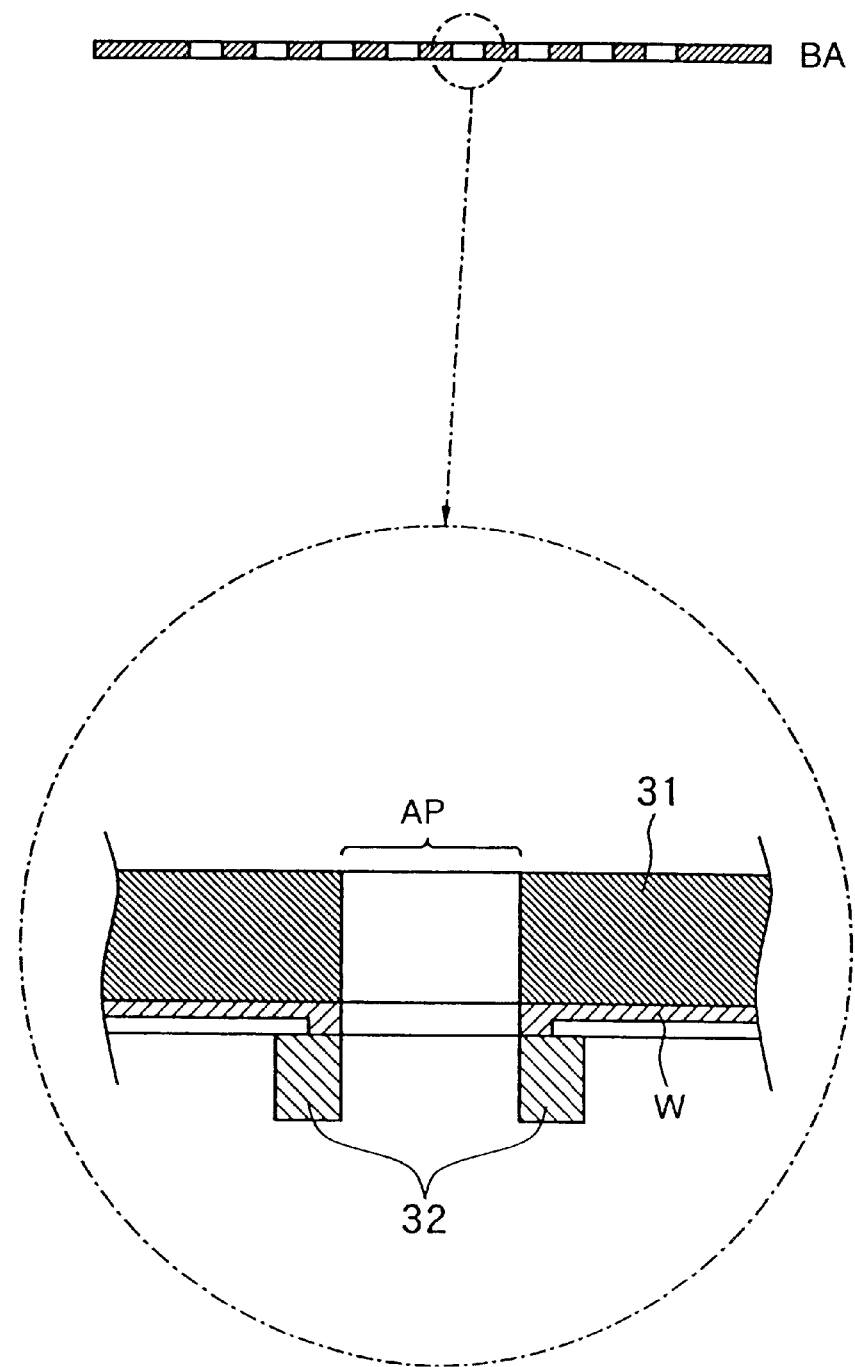
FIG. 3 is a view showing one deflector formed on a blanker array.
Figure 4:
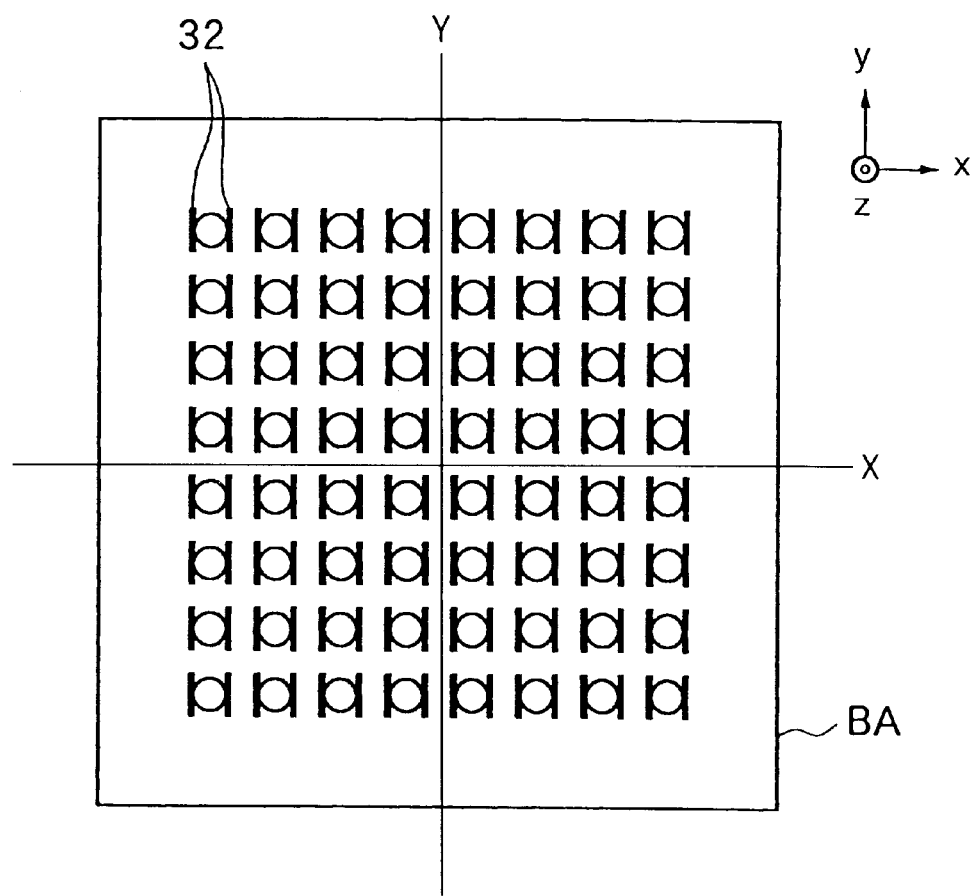
FIG. 4 is a bottom view of the blanker array.

The blanker array BA is obtained by forming on one substrate a plurality of deflectors for individually deflecting electron beams formed by the aperture array AA. FIG. 3 is a view showing one deflector formed in the blanker array BA. The blanker array BA has a substrate 31 having a plurality of apertures AP, blankers 32 each of which is made up of a pair of electrodes via an aperture AP and has a deflection function, and wiring lines W for individually turning on/off the blankers 32. FIG. 4 is a bottom view of the blanker array BA.

The element electron optical system array unit LAU is formed from first and second electron optical system arrays LA1 and LA2 as electron lens arrays each having a plurality of electron lenses two-dimensionally arrayed on the same plane.

Figure 5:
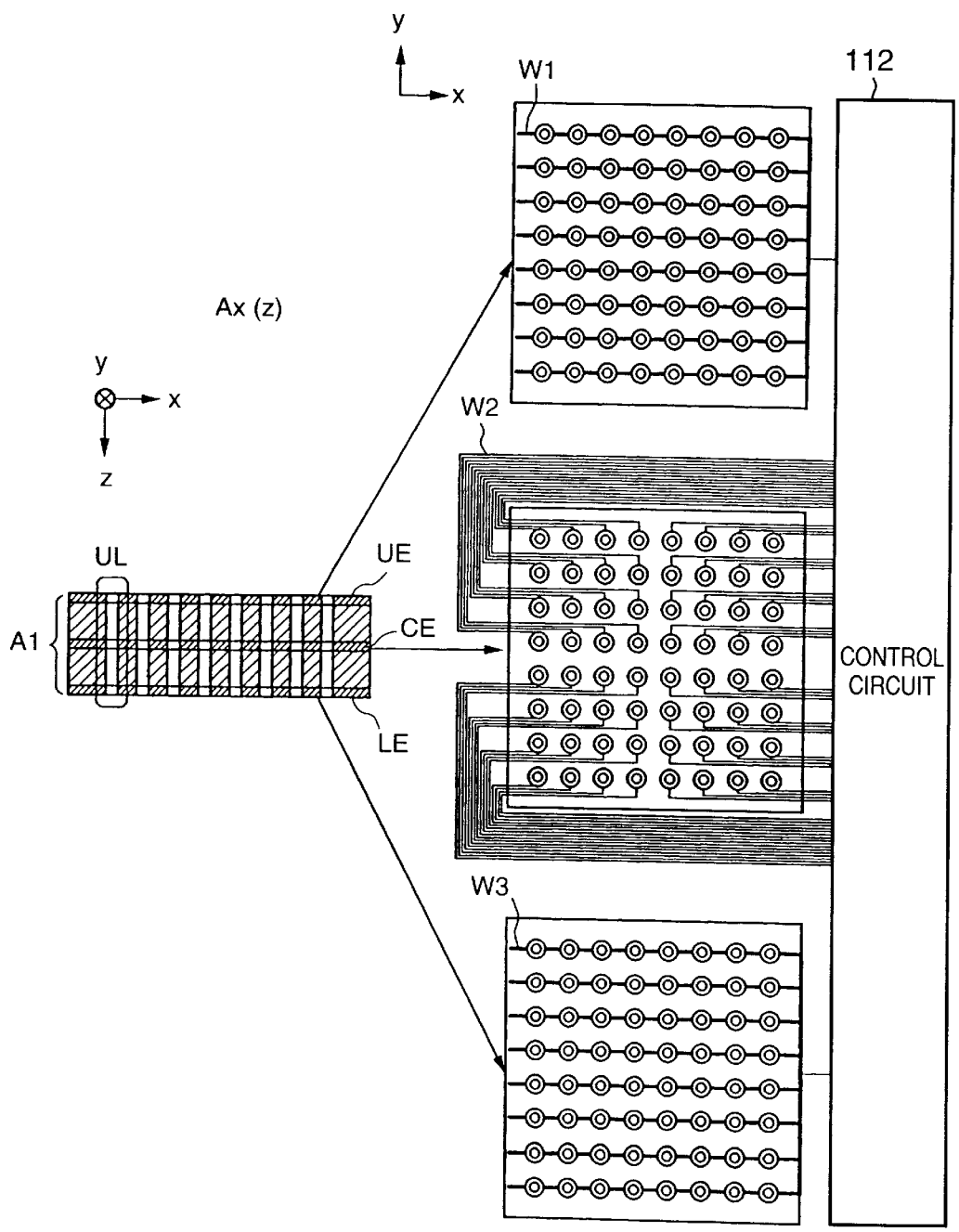
FIG. 5 is a view for explaining first and second electron optical system arrays.

FIG. 5 is a view for explaining the first electron optical system array LA1. The first electron optical system array LA1 has three, upper, intermediate, and lower electrode plates UE, CE, and LE on each of which a plurality of doughnut-like electrodes respectively corresponding to a plurality of apertures are aligned. The three electrode plates are stacked via insulators.

The doughnut-like electrodes of the upper, intermediate, and lower electrode plates at the same X- and Y-coordinates form one electron lens (so-called unipotential lens) UL. The doughnut-like electrode of the upper electrode plate UE of each electron lens UL is connected to an LAU control circuit 112 via a common wiring line W1, and the doughnut-like electrode of the lower electrode plate LE of each electron lens UL is connected to the LAU control circuit 112 via a common wiring line W3. An electron beam acceleration potential is applied between the doughnut-like electrodes of the upper and lower electrode plates UE and LE. The doughnut-like electrode of the intermediate electrode plate CE of each electron lens receives a proper potential from the LAU control circuit 112 via an individual wiring line W2. This structure can set electrooptic power (focal length) of each electron lens to a desired value.

The second electron optical system array LA2 also has the same structure and function as those of the first electron optical system array LA1.

As shown in FIG. 2B, in the element electron optical system array unit LAU, the electron lenses of the first and second electron lens arrays LA1 and LA2 at the same X- and Y- coordinates form one element electron optical system EL.

The aperture array AA is positioned on almost the front focal position side of the respective element electron optical systems EL. Each element electron optical system EL, therefore, forms an intermediate image of the electron source ES at almost the rear focal position by each divided electron beam. To correct the curvature of field generated upon reducing and projecting an intermediate image on the substrate 5 via the reduction electron optical system 4, a potential applied to the doughnut-like electrode of the intermediate electrode plate is adjusted for each element electron optical system EL to adjust the electrooptic power of the electron lens, thereby adjusting the intermediate image formation position.

Similar to the aperture array AA, the stopper array SA has a plurality of apertures formed in a substrate. An electron beam deflected by the blanker array BA irradiates a portion outside an aperture of the stopper array SA corresponding to the electron beam, and is shielded by the substrate.

Figure 6:
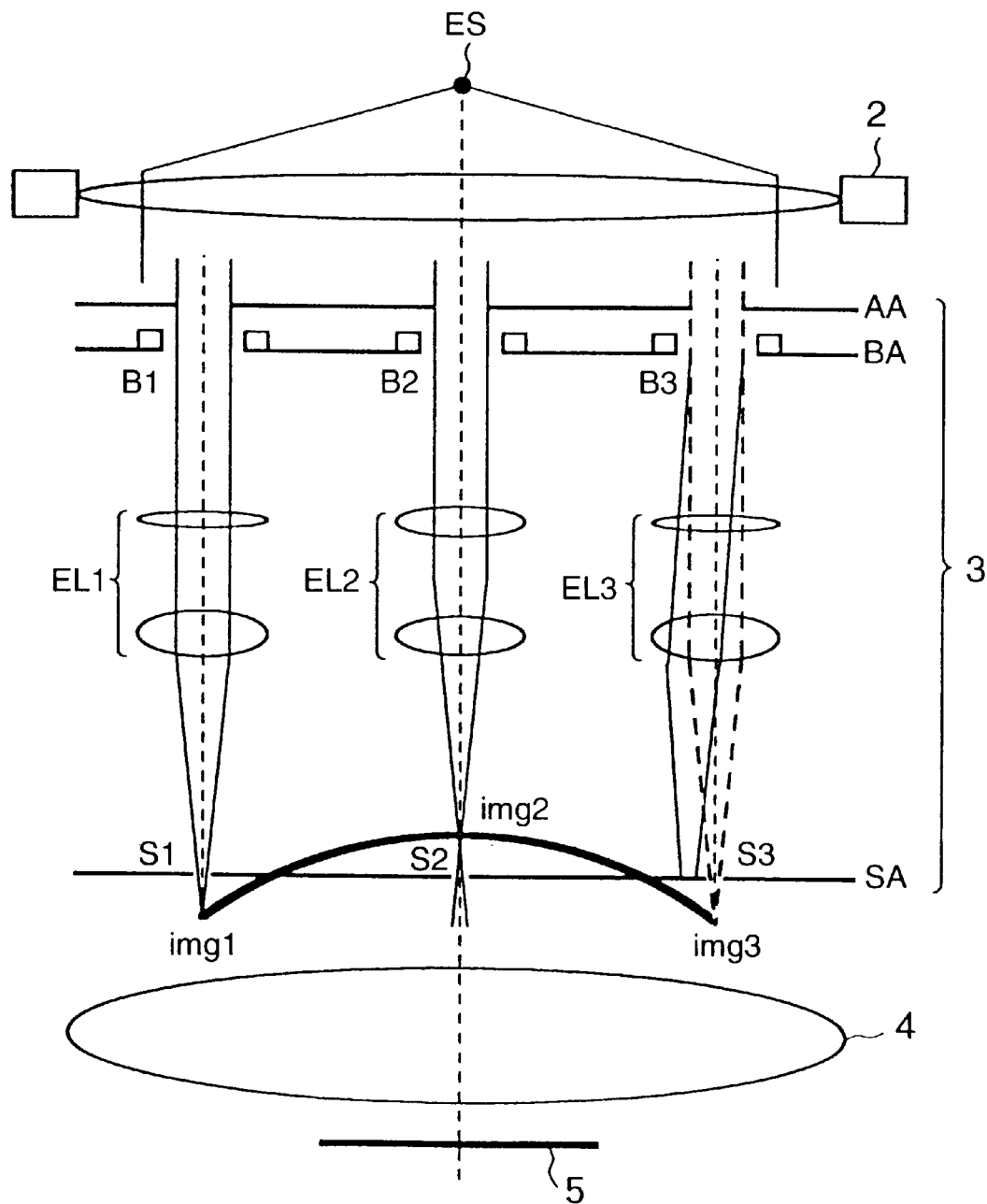
FIG. 6 is a view for explaining the function of the element electron optical system array.

The function of the element electron optical system array 3 will be explained with reference to FIG. 6. Electrons emitted by the electron source ES pass through the condenser lens 2 to form an almost parallel electron beam. Almost the parallel electron beam is divided into a plurality of electron beams by the aperture array AA having a plurality of apertures. The divided electron beams enter element electron optical systems EL1 to EL3 to form intermediate images img1 to img3 of the electron source ES at almost the rear focal positions of the respective element electron optical systems. These intermediate images are projected via the reduction electron optical system 4 on the substrate 5 serving as a surface to be exposed.

To correct the curvature of field (shift between an actual imaging position and an ideal imaging position on the substrate 5 along the optical axis of the reduction electron optical system 4) generated upon projecting a plurality of intermediate images on the surface to be exposed, the optical characteristics of a plurality of element electron optical systems are individually set to change the intermediate image formation position along the optical axis for each element electron optical system.

Whether to irradiate the substrate 5 with each electron beam is individually controlled by blankers B1 to B3 of the blanker array BA and stoppers S1 to S3 of the stopper array SA. In FIG. 6, since the blanker B3 is ON, an electron beam for forming the intermediate image img3 does not pass through the aperture S3 of the stopper array SA, and is shielded by the substrate of the stopper array SA.

Figure 7:
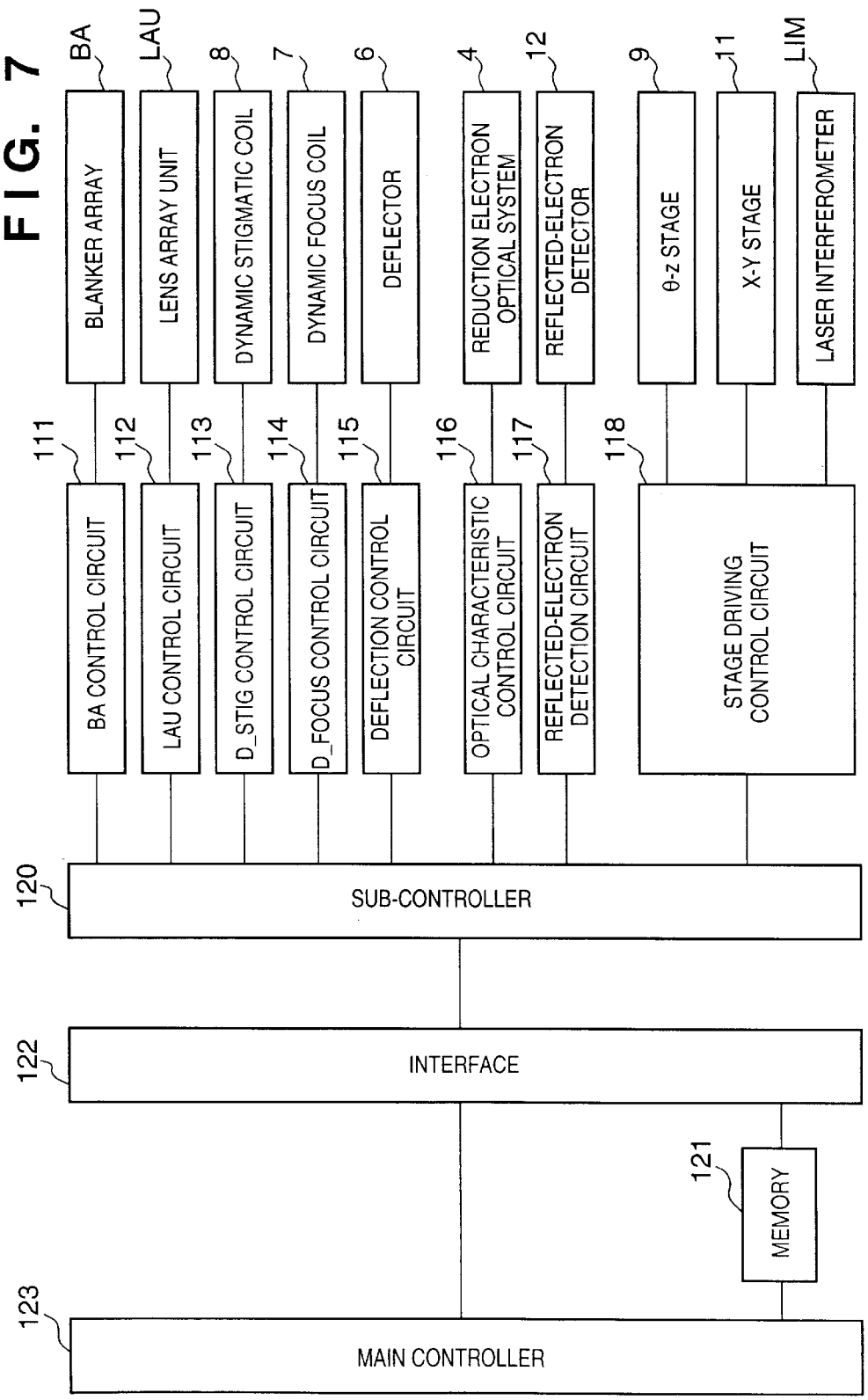
FIG. 7 is a block diagram showing the arrangement of the control system of the electron beam exposure apparatus shown in FIG. 1.

FIG. 7 is a block diagram showing the arrangement of the control system of the electron beam exposure apparatus 100 shown in FIG. 1. A BA control circuit 111 individually controls ON/OFF operation of the respective blankers of the blanker array BA. The LAU control circuit 112 controls the focal length of the electron lens EL forming the lens array unit LAU. A D_STIG control circuit 113 controls the dynamic stigmatic coil 8 to correct astigmatism of the reduction electron optical system 4. A D_FOCUS control circuit 114 controls the dynamic focus coil 7 to adjust the focus of the reduction electron optical system 4. A deflection control circuit 115 controls the deflector 6. An optical characteristic control circuit 116 controls the optical characteristics (magnification and distortion) of the reduction electron optical system 4. A reflected-electron detection circuit 117 calculates a reflected electron amount on the basis of a signal from the reflected-electron detector 12.

A stage driving control circuit 118 drives and controls the θ-Z stage 9, and drives and controls the X-Y stage 11 in cooperation with a laser interferometer LIM for detecting the position of the X-Y stage 11.

A sub-controller 120 reads out exposure control data from a memory 121 via an interface 122 to control the control circuits 111 to 116 and 118 based on the readout data, and controls the reflected-electron detection circuit 117. A main controller 123 integrally controls the whole electron beam exposure apparatus 100.

The schematic operation of the electron beam exposure apparatus 100 shown in FIG. 1 will be described with reference to FIG. 7.

The sub-controller 120 reads out exposure control data from the memory 121, extracts, from the exposure control data, deflection control data (main deflector reference position, sub-deflector reference position, main deflection stage following data, and deflection control data) as control data for controlling the deflector 6, and provides the extracted data to the deflection control circuit 115. In addition, the sub-controller 120 extracts, from the exposure control data, blanker control data (e.g., dot control data for controlling ON/OFF operation of the blanker, and dose control data for controlling the dose for each partial exposure field) as control data for controlling each blanker of the blanker array BA, and provides the extracted data to the BA control circuit 111.

The deflection control circuit 115 controls the deflector 6 based on the deflection control data to deflect a plurality of electron beams. At the same time, the BA control circuit 111 controls each blanker of the blanker array BA to turn on/off the blanker in accordance with a pattern to be drawn on the substrate 5. In scanning the substrate 5 with a plurality of electron beams in order to draw a pattern on the substrate 5, the X-Y stage 11 is continuously driven in the Y direction, and a plurality of electron beams are deflected by the deflector 6 so as to follow movement of the X-Y stage 11.

Figure 8:
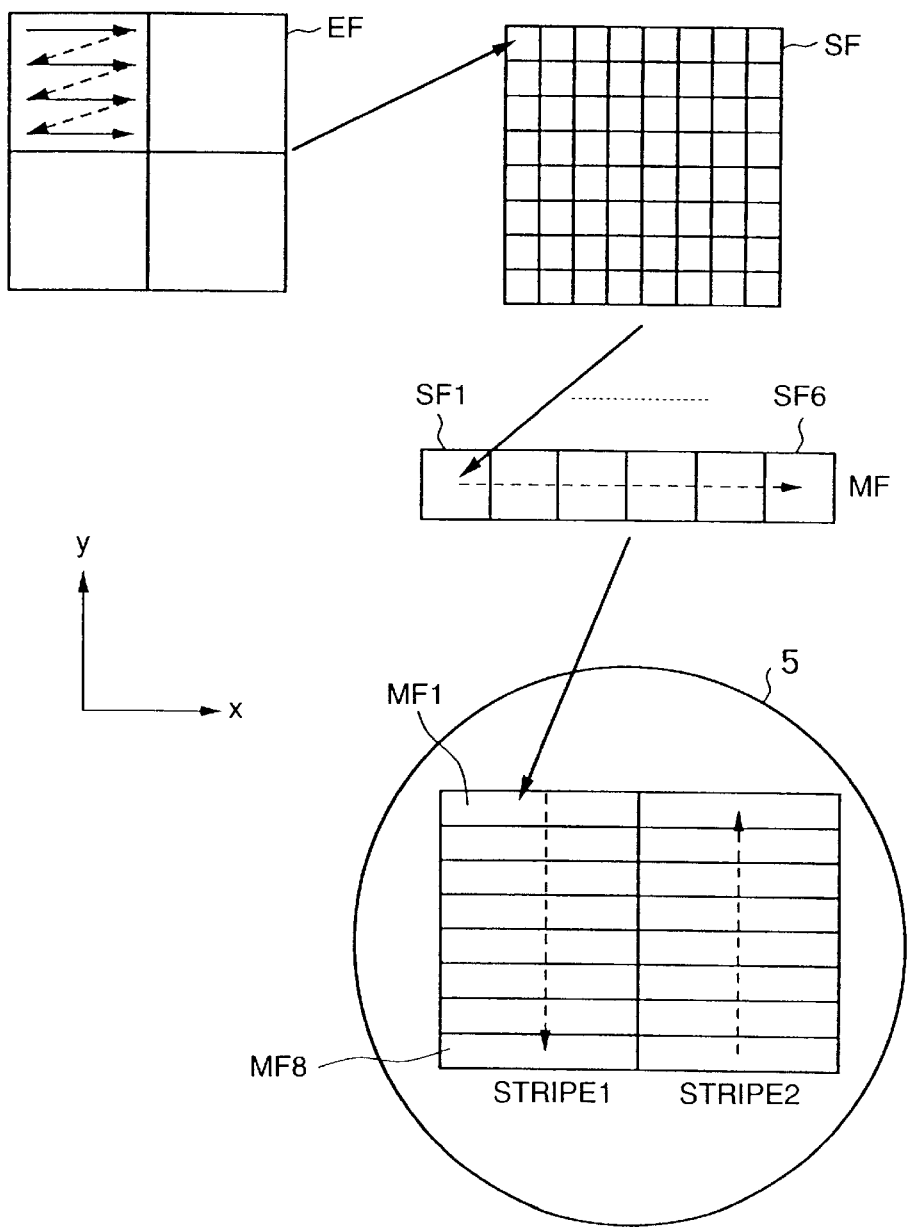
FIG. 8 is a view for explaining the exposure principle of the electron beam exposure apparatus shown in FIG. 1.

As shown in FIG. 8, each electron beam scans and exposes a corresponding element exposure field (EF) on the substrate 5. This electron beam exposure apparatus is designed such that element exposure fields (EF) for respective electron beams are two-dimensionally adjacent to each other, and a subfield (SF) formed from a plurality of element exposure fields (EF) is exposed at once. In this embodiment, the element electron optical system array 3 has 8×8 apertures, and thus one element exposure field (EF) has a matrix of 8×8 elements, as shown in FIG. 8. Each element of this matrix represents a field (position) where the substrate 5 is irradiated with an electron beam deflected by the deflector 6. In other words, one element exposure field (EF) having a matrix of 8×8 elements is scanned and exposed with one electron beam. Note that scan/exposure operation in the element exposure field will be described below.

After one subfield (SF1) is exposed, the sub-controller 120 instructs the deflection control circuit 115 to deflect a plurality of electron beams by the deflector 6 in a direction (X direction) perpendicular to the scan direction (Y direction) of the X-Y stage 11 in scan/exposure so as to expose the next subfield (SF2).

Aberration upon reducing and projecting each electron beam via the reduction electron optical system 4 also changes with switching of the subfield. The sub-controller 120 instructs the LAU control circuit 112, D_STIG control circuit 113, and D_FOCUS control circuit 114 to adjust the lens array unit LAU, dynamic stigmatic coil 8, and dynamic focus coil 7 so as to correct the changed aberration.

After the subfield is switched, a plurality of electron beams execute exposure of corresponding element exposure fields (EF) again to expose the second subfield (SF2). As shown in FIG. 8, exposure of subfields SF1 to SF6 is sequentially executed to complete exposure of a main field (MF) formed from the subfields SF1 to SF6 aligned in the direction (X direction) perpendicular to the scan direction (Y direction) of the X-Y stage 11 in scan/exposure.

After exposure of the first main field (MF1) shown in FIG. 8 is completed in this manner, the sub-controller 120 instructs the deflection control circuit 115 to sequentially deflect a plurality of electron beams to main fields (MF2, MF3, MF4, . . . ) aligned in the scan direction (Y direction) of the X-Y stage 11 and execute exposure As a result, as shown in FIG. 8, exposure of a stripe field (STRIPE1) formed from the main fields (MF1, MF2, MF3, MF4, . . . ) is executed.

The sub-controller 120 instructs the stage driving control circuit 118 to move the X-Y stage 11 by one step in the X direction, and executes exposure of the next stripe field (STRIPE2).

Figure 10:
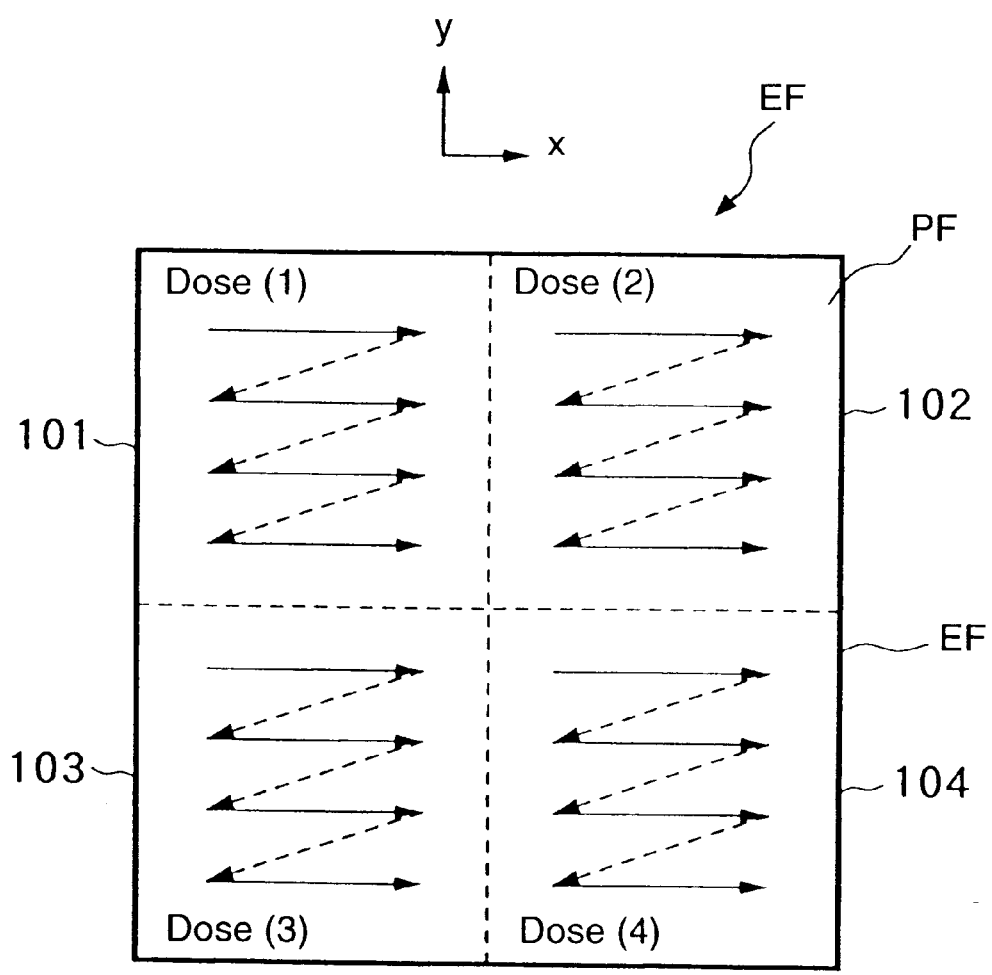
FIG. 10 is a view for explaining scan/exposure to an element exposure field with a charged particle beam according to the embodiment.

Scan/exposure control in each element exposure field will be explained. FIG. 10 is a view for explaining the scan/exposure order in this embodiment. In this embodiment, as shown in FIG. 10, each element exposure field EF is subdivided into four partial fields (PF) 101 to 104, and a dose is set for each partial field. Note that this embodiment exemplifies a case wherein the element exposure field EF is divided into four, but the division number is not limited to this. The size of each partial field is preferably smaller than a circle having the backward scattering diameter of an electron beam in order to effectively exclude the influence of the proximity effect. The dose for each partial field is determined by the following sequence. Scan/exposure of each partial field is continuously executed with its determined dose to complete pattern drawing in this partial field. More specifically, drawing is completed for each of the partial fields (PF). 101 to 104 in units of partial fields PF, and the dose is also set for each partial field.

In this embodiment, as shown in FIG. 10, the partial field PF (a field of 4×4 dots because the element exposure field of 8×8 dots is divided into four in this embodiment) is raster-scanned with an electron beam (the X direction is the main scan direction, and the Y direction is the subscan direction) to draw a pattern. Scan/exposure in each partial field is done while the X-Y stage 11 is moved in the Y direction, as described above.

This processing is sequentially executed at doses set for all the partial fields in the element exposure field to complete drawing in the element exposure field. At this time, the selection order of partial fields to be processed is the partial field 101 of Dose(1)→the partial field 102 of Dose(2)→the partial field 103 of Dose(3)→the partial field 104 of Dose(4) in FIG. 10. The partial fields are preferably selected in this order to complete scan/exposure. That is, similar to raster scan of an electron beam, partial fields successive in the X direction are sequentially selected, which is repeated in the Y direction. In this specification, this partial field selection order is called raster-sequential selection.

A dose (electron beam dosage) determination method performed to correct the proximity effect will be explained.

This embodiment applies an area density map method or representative figure method as a known technique in order to correct the proximity effect. In this embodiment, exposure control data (including dot control data and dose control data) is generated by an external information processing apparatus, and provided to the electron beam exposure apparatus.

Figure 18:
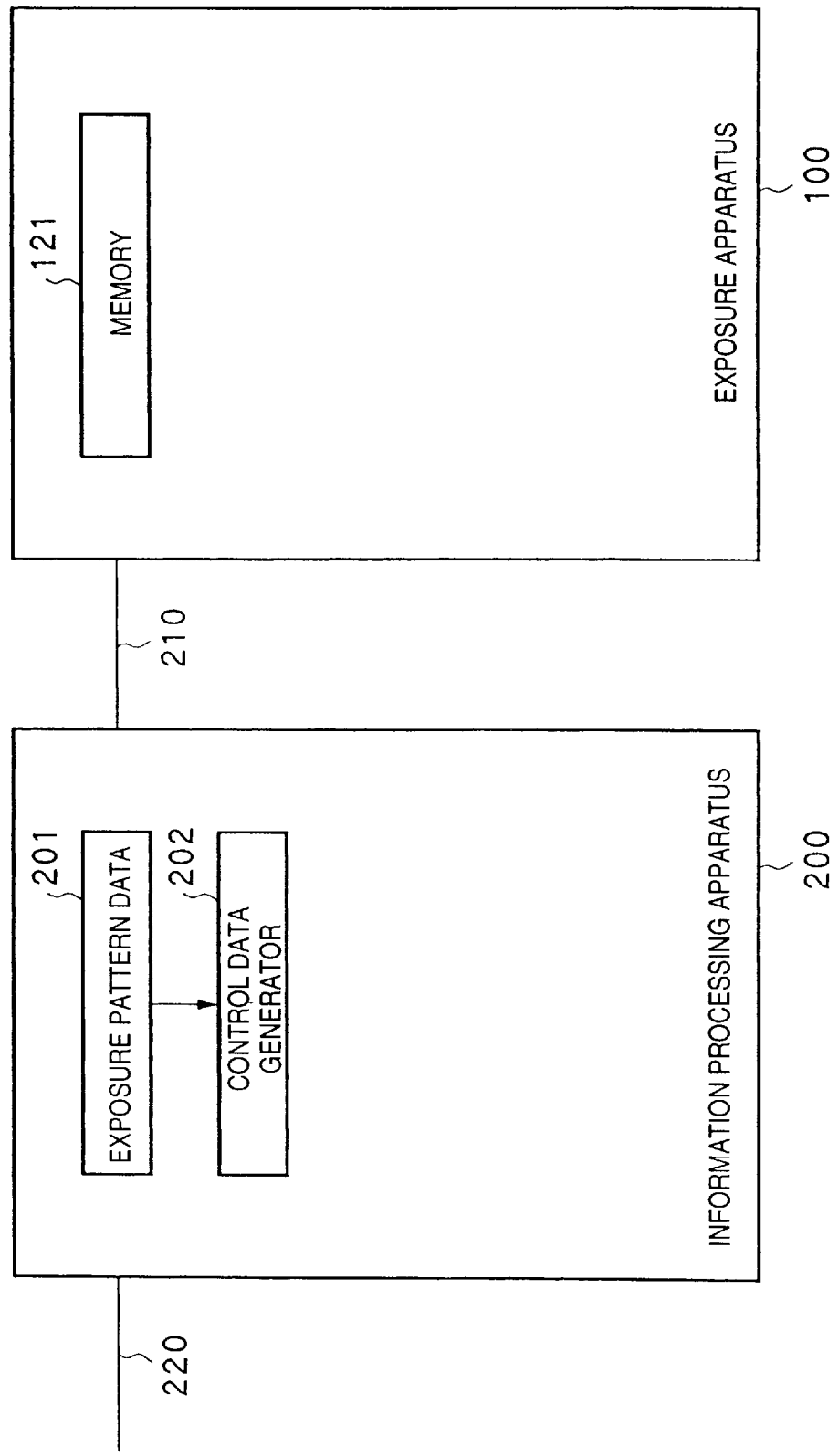
FIG. 18 is a block diagram showing the configuration of an exposure system according to a preferred embodiment of the present invention.

FIG. 18 is a block diagram showing the configuration of an exposure system according to a preferred embodiment of the present invention. This exposure system is constituted by connecting the electron beam exposure apparatus 100 shown in FIG. 1 and an information processing apparatus 200 via a communication cable 210. The information processing apparatus 200 acquires, e.g., exposure pattern data from another information processing apparatus via a communication cable 220, generates compressed exposure control data suited for the electron beam exposure apparatus 100 on the basis of the exposure pattern data, and provides the generated data to the electron beam exposure apparatus 100 via the communication cable 210.

More specifically, the information processing apparatus 200 acquires exposure pattern data from another information processing apparatus via the communication cable 220, and stores the exposure pattern data in a storage 201. The exposure pattern data may be acquired from a memory medium (e.g., a magnetic tape or disk) which stores the data.

The information processing apparatus 200 generates in a control data generator 202 exposure control data (including, e.g., dot control data for controlling ON/OFF operation of the blanker, dose control data for controlling the dose of each partial field, and deflection control data for controlling the deflector) for controlling exposure operation of the electron beam exposure apparatus 100 on the basis of the exposure pattern data.

The information processing apparatus 200 provides the generated exposure control data to the electron beam exposure apparatus 100 via, e.g., the communication cable 210.

The electron beam exposure apparatus 100 stores the received exposure control data in the memory 121, appropriately reads out the stored exposure control data, and executes scan/exposure in accordance with the readout exposure control data.

In this configuration, the information processing apparatus 200 determines a dose corresponding to each partial field. As described above, the exposure control data generator 202 generates dose control data. A dose determination method using the area density map method will be explained.

Figure 11:
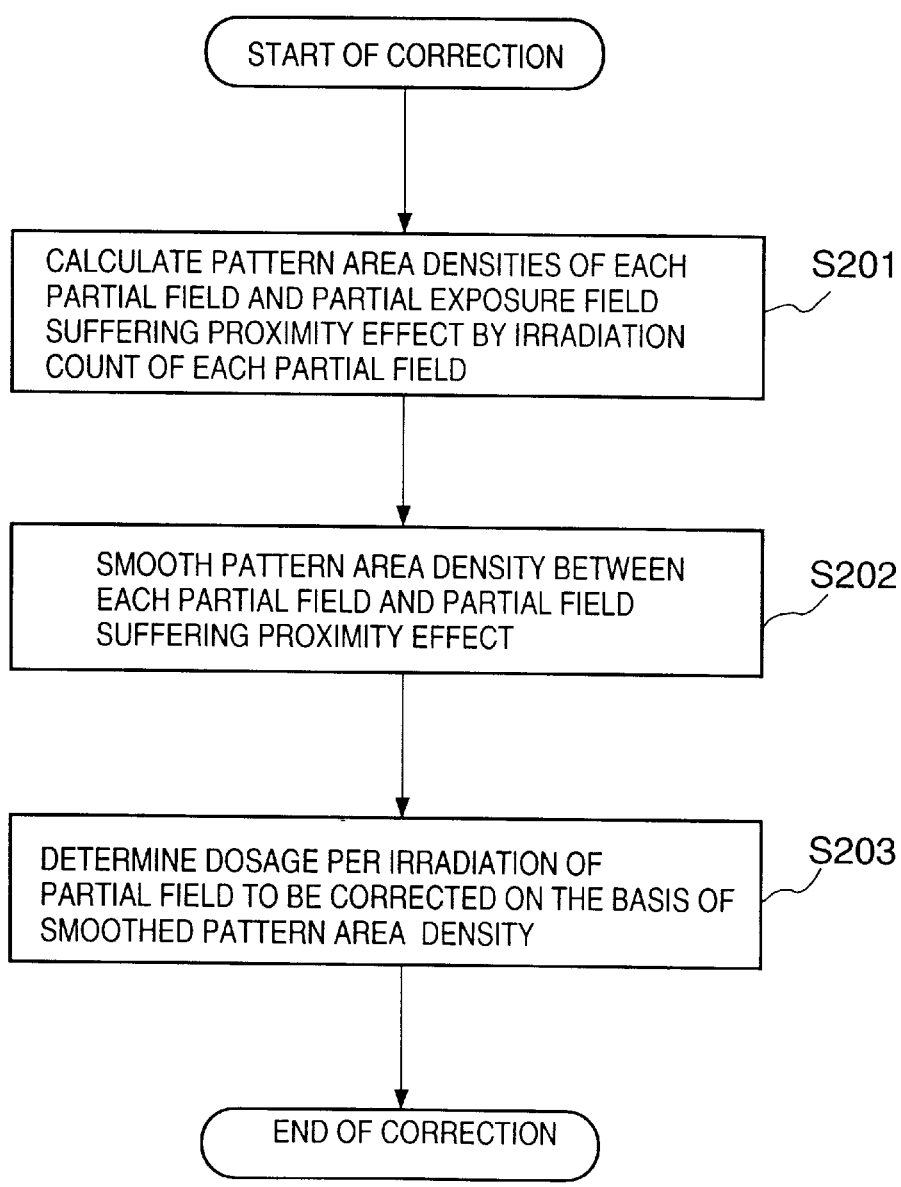
FIG. 11 is a flow chart for explaining a dose determination sequence using an area density map method.
Figure 13:
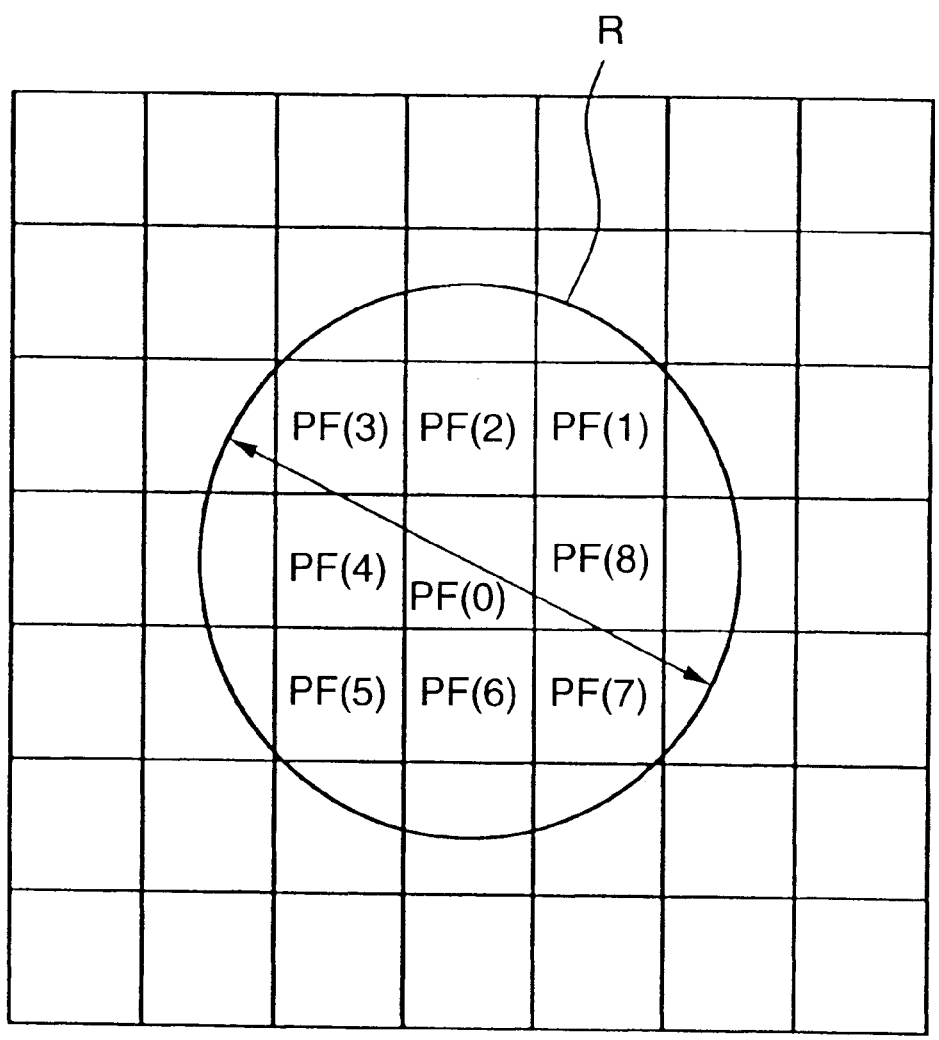
FIG. 13 is a view showing a state in which a pattern to be drawn is divided in units of partial fields.

FIG. 11 is a flow chart showing a dose determination sequence using the area density map method. FIG. 13 is a view showing a state in which a pattern to be drawn is divided in units of partial fields.

In step S201, partial fields included in a field (proximity effect field) assumed to suffer the influence of the proximity effect centered on a partial field whose dose is to be determined are extracted. Then, electron beam irradiation area densities (pattern area densities) in these partial fields are obtained.

With reference to FIG. 13, a partial field PF(0) is a partial field whose dose is to be determined. R is a circle having a diameter about three times a backward scattering diameter σb of an electron beam on a wafer centered on the partial field PF(0). In step S201, partial fields included in this circle are selected. In the example of FIG. 13, PF(1) to PF(8) are selected. That is, the selected partial fields are assumed to give the influence of the proximity effect to the partial field PF(0) whose dose is to be determined.

From an electron beam irradiation count $N_i$ of a previously obtained partial field PF(i), a pattern area density $\alpha_i$ of the partial field PF(i) is calculated by $$\alpha_i = N_i / N_{max}$$

(where i=0 to 8, and $N_{max}$ is the number of array positions in the partial field.)

In step S202, the pattern area density $\alpha_i$ of each partial field is used to smooth the pattern area density between the partial fields (partial field whose dose is to be determined and partial fields within the proximity effect field) selected in step S201, thereby obtaining $\alpha_{av}$:

$$\alpha_{av} = \Sigma \alpha_i / (i_{max} + 1)$$

where $i_{max}$ is the number of partial fields selected in step S201.

In step S203, an irradiation time t per irradiation (corresponding to a dose per irradiation) in the partial field PF(0) whose dose is to be determined is calculated based on the smoothed pattern area density:

$$t=ts\times(1+\eta)/(1+2\times\eta\times\alpha_{av})$$

This is determined as the dose of the partial field PF(0).

Figure 12:
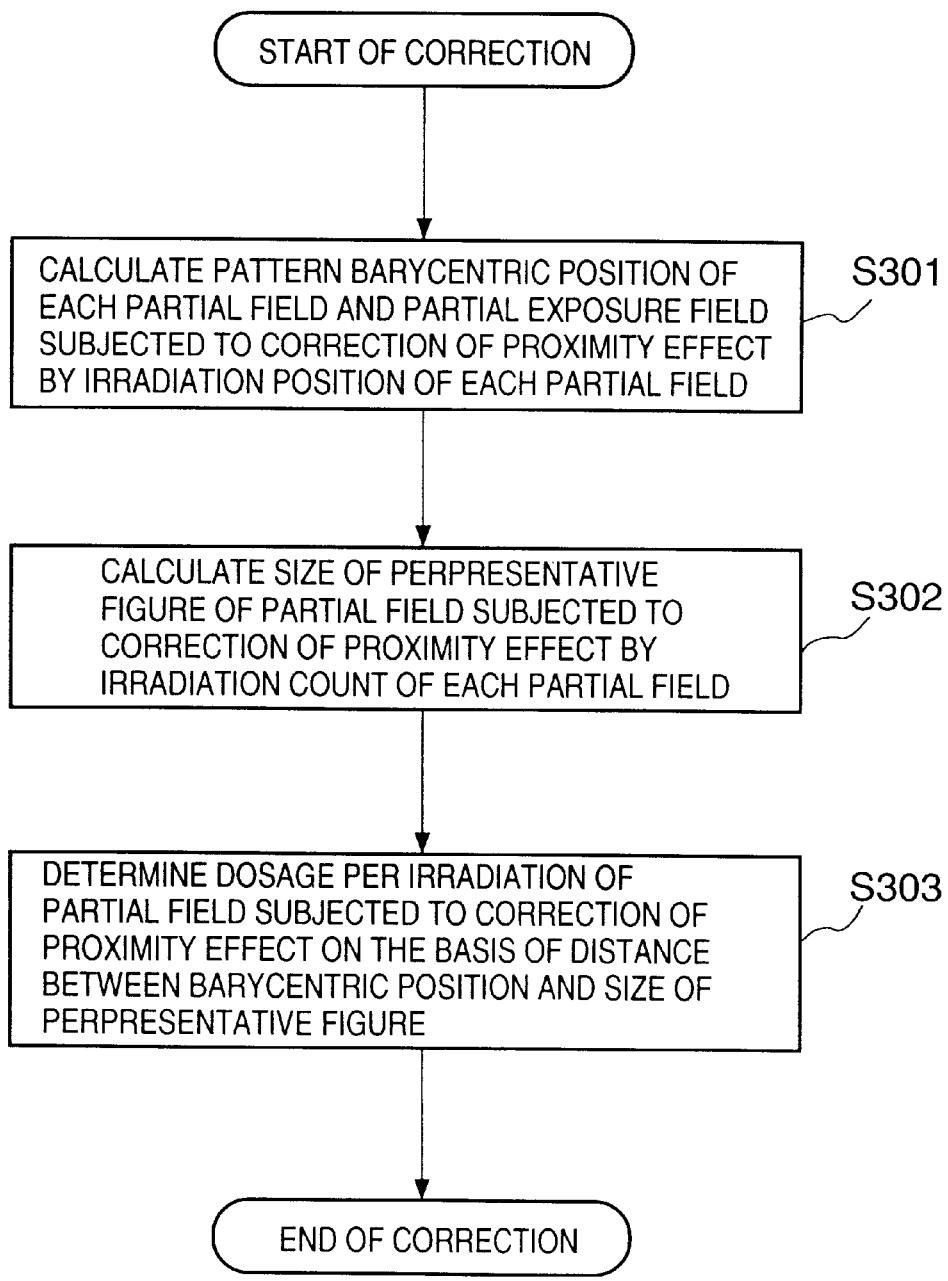
FIG. 12 is a flow chart for explaining dose determination processing using a representative figure method.

A dose determination method using the representative figure method will be explained. FIG. 12 is a flow chart for explaining dose determination processing using the representative figure method.

In step S301, similar to the area density map method described above, partial fields included in a circle which is centered on the partial field PF(0) whose dose is to be determined and has a diameter about three times the backward scattering diameter σb of an electron beam on a wafer are extracted, as shown in FIG. 13. The average value of the irradiation positions of a plurality of electron beams in a previously obtained partial field PF(i) is calculated, and defined as a barycentric position (Xi, Yi) of a pattern to be drawn in the partial field PF(i).

In step S302, a representative figure size Ai of a pattern to be drawn in each partial field is obtained from an electron beam irradiation count $N_i$ in the previously obtained partial field PF(i):

$$Ai=\sqrt{N_i}$$

In step S303, the irradiation time t per irradiation (corresponding to a dose per irradiation) in the partial field to be corrected is calculated based on the calculated barycentric position and representative figure size of each partial field:

$$t=ts\times(1+\eta)\Sigma[erf\{(Xi-X0+Ai)/\sigma b\}-erf\{(Xi-X0-Ai)/\sigma b\}\times erf\{(Yi-Y0+Ai)/\sigma b\}-erf\{(Yi-Y0-Ai)/\sigma b\}$$

where η is the backward scattering coefficient, ts is an irradiation time per standard irradiation set before the proximity effect is corrected, and $erf(P)=\frac{1}{2}\sqrt{\pi}\int\epsilon^{-u^2}du$.

Control of the blanker array BA according to this embodiment will be described.

Figure 14:
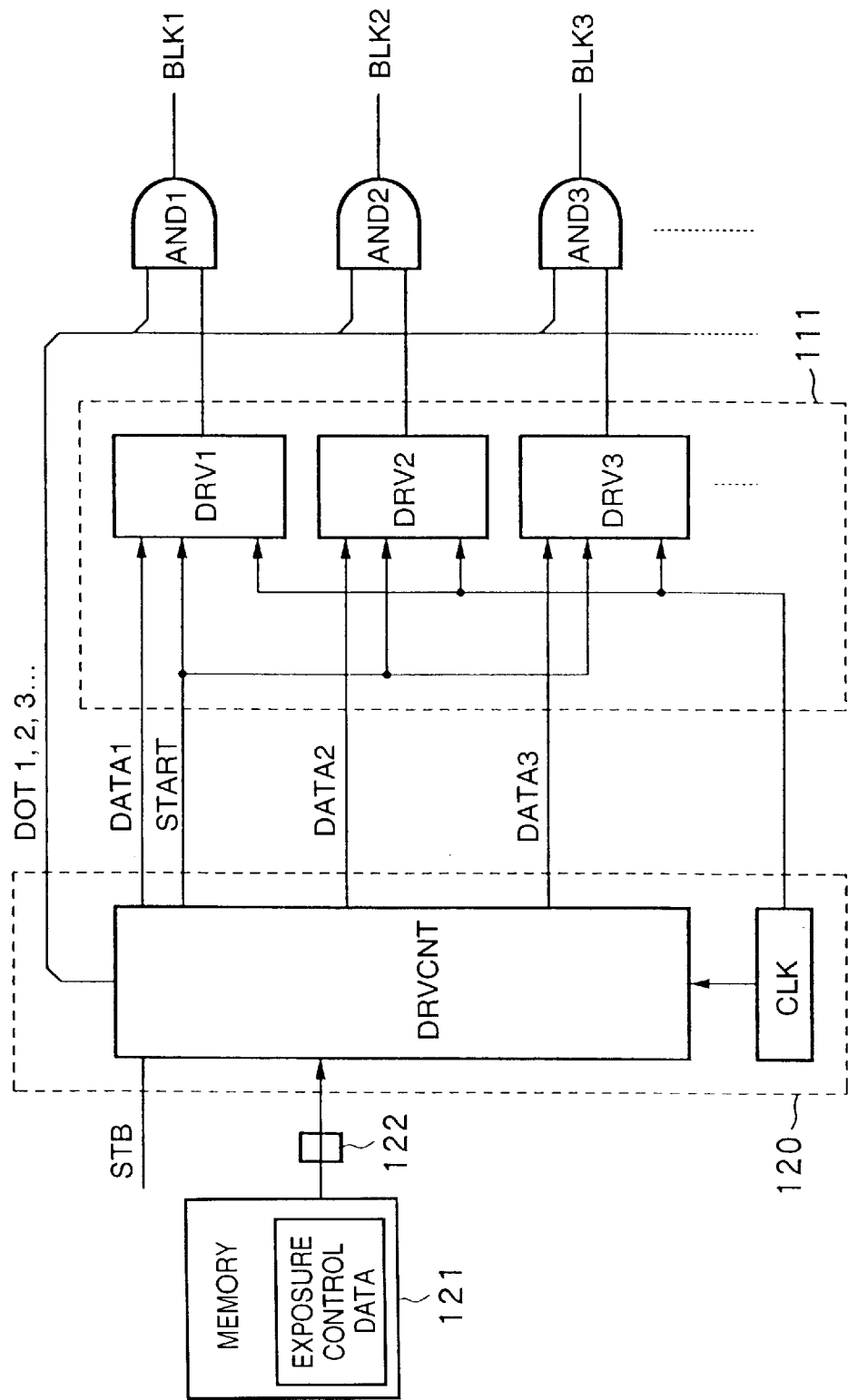
FIG. 14 is a block diagram showing the detailed arrangements of part (relating to a BA control circuit) of a sub-controller 120 and a BA control circuit 111 according to the embodiment.

FIG. 14 is a block diagram showing the detailed arrangements of part (relating to a BA control circuit) of the sub-controller 120 and the BA control circuit 111 according to this embodiment. As described above, the memory 121 stores compressed exposure control data (including dot control data and dose control data for each partial field) generated by an external information processing apparatus.

A driving controller DRVCNT acquires from the memory 121 via an interface 122 exposure control data (including dot control data and dose control data for each partial field) concerning a partial field to be scanned/exposed. Since this embodiment adopts a multi-electron beam type exposure apparatus, the driving controller DRVCNT acquires exposure control data equal in number to electron beams (number of fields to be simultaneously scanned/exposed), and decompresses the acquired data. Then, the driving controller DRVCNT outputs dose data (DATA 1, 2, 3, . . . ) to driving units DRV 1, 2, 3, . . . for driving corresponding blankers. Driving units DRV 1, 2, 3, . . . generate and output pulse signals which are enabled during irradiation times determined in accordance with the received dose data. The pulse signals output from driving units DRV 1, 2, 3 . . . are respectively input to AND 1, 2, 3, . . . . Outputs from AND 1, 2, 3, . . . are supplied to corresponding blankers (BLK 1, 2, 3, . . . ).

On the other hand, the driving controller DRVCNT generates, based on the dot control data, signals (DOT 1, 2, 3, . . . ) each representing the ON/OFF state of each dot in drawing a pattern, and supplies the signals to corresponding AND 1, 2, 3, . . . .

As a result, outputs from AND 1, 2, 3, . . . are enabled/disabled in accordance with a drawing pattern, and their ON times provide proper doses to realize scan/exposure with the proper doses. Note that a clock generation circuit generates a clock for synchronizing operation in exposure and data transfer operation.

Figure 15:
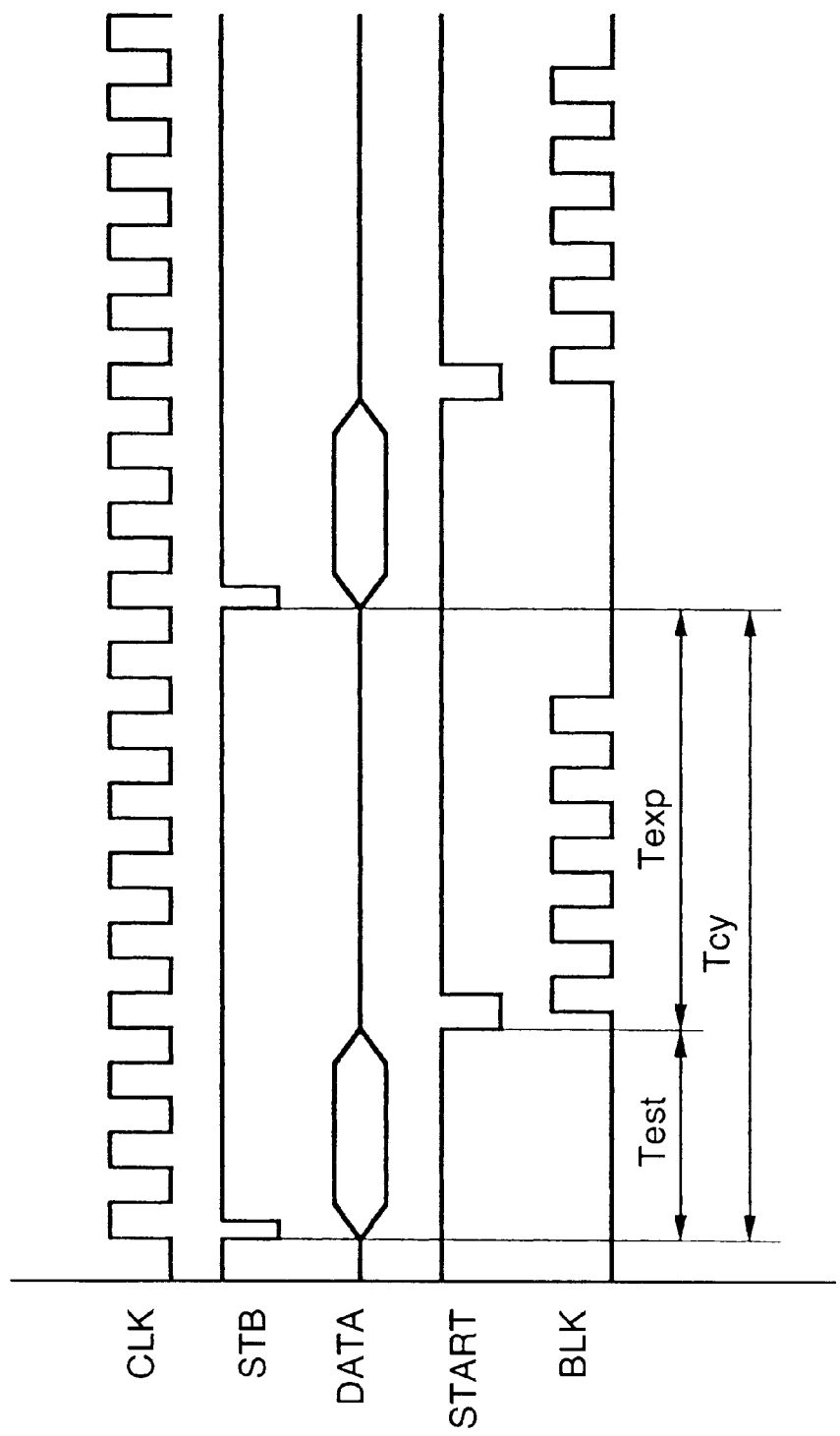
FIG. 15 is a timing chart showing data transfer timings from a driving controller DRVCNT to driving units DRV 1, 2, 3, . . . in the block diagram shown in FIG. 14.

FIG. 15 is a timing chart showing data transfer timings from the driving controller DRVCNT to driving units DRV 1, 2, 3, . . . in the block diagram shown in FIG. 14. Prior to the start of scan/exposure for each partial field, exposure data and dose data are loaded to each driving unit in synchronism with a strobe signal (STB). A start signal is transmitted at the end timing of loading data. Driving units DRV 1, 2, 3, . . . start driving control corresponding to scan/exposure of partial fields in response to the START signal. As shown in FIG. 15, a time Tcy required for scan/exposure of the partial field is the sum of a set ring time Tset required for transfer and setting of DATA to the driving circuit DRV, and an actual drawing time Texp for the partial field with an electron beam.

Figure 9:
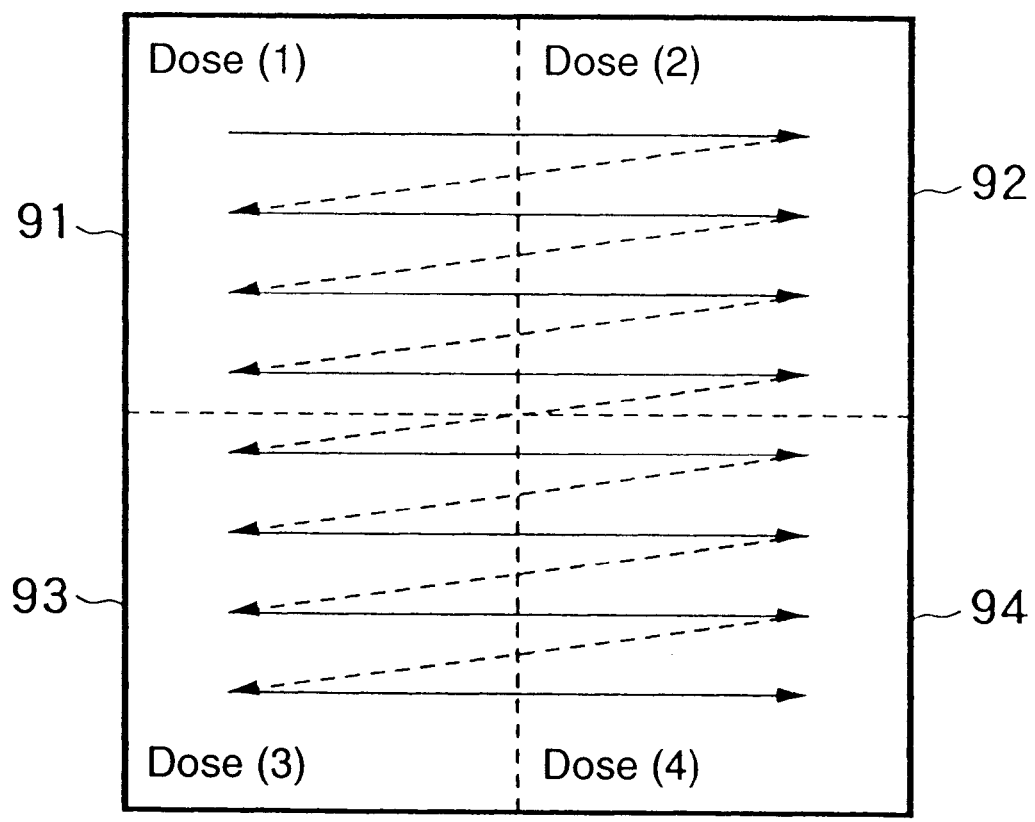
FIG. 9 is a view for explaining general scan/exposure to an element exposure field with a charged particle beam.

If the dose is changed for each partial field in scan/exposure as shown in FIG. 9, data transfer and setting to the driving circuit DRV are frequently executed to increase the set ring time Tset. To the contrary, since this embodiment performs exposure/scan, as shown in FIG. 10, the set ring time appears only once for each partial field, and both a constantly high exposure throughput and effective correction of the proximity effect can be realized.

Figure 19:
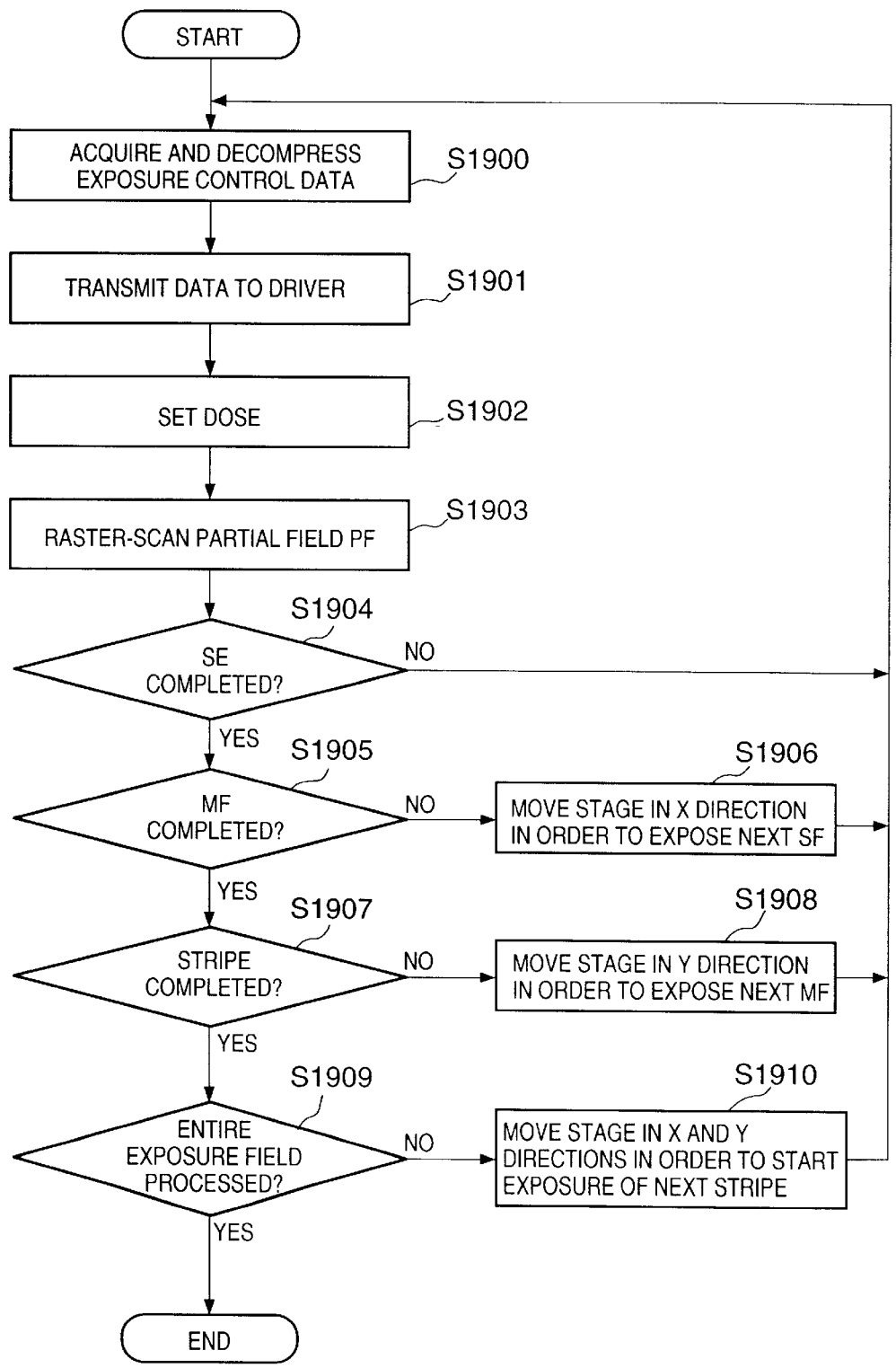
FIG. 19 is a flow chart for explaining exposure processing of the electron beam exposure apparatus according to the embodiment.

FIG. 19 is a flow chart for explaining the processes of the sub-controller 120 and driver 111 in exposure processing operation according to this embodiment. Note that, as shown in FIG. 8, the element exposure field EF has a size falling within a range where aberration by the electron optical system is suppressed to a predetermined amount or less. The partial field PF is prepared by dividing the element exposure field EF into four, and the size of the partial field PF is set smaller than a circuit having the backward scattering diameter of a charged particle beam on a surface to be exposed on the substrate 5.

If the main controller 123 instructs start of exposure processing, the sub-controller 120 acquires in step S1900 from the memory 121 via the interface 122 compressed exposure control data containing dot control data and dose control data for each partial field, and decompresses the acquired data. In step S1901, the sub-controller 120 transmits the dose control data and dot control data acquired in step S1900 to driving units DRV 1, 2, . . . of the driver 111.

In step S1902, each driving unit sets a dose in a corresponding partial field PF on the basis of the transmitted dose control data. After the dose is set, the driving unit exposes the partial field PF on the basis of the received dot control data in step S1903. In this case, raster-sequential exposure is done. After exposure processing of the partial field PF ends, the processing shifts to step S1904 to determine whether processing of the subfield SF ends. If an unprocessed partial field exists in the subfield SF, the processing returns to step S1901 to repeat the above processing for the next partial field PF.

If exposure of the subfield SF shown in FIG. 8 is completed in this manner, the processing advances from step S1904 to step S1905. In step S1905, whether exposure of a main field MF to which the subfield SF belongs is completed is checked. If an unexposed subfield exists in the main field, the processing advances to step S1906 to move the stage 11 in the X direction in order to expose the next subfield SF, and then returns to step S1901. The above processing is repeated for the new subfield.

If YES in step S1905, whether exposure of a stripe field STRIPE to which the exposed main field MF belongs is completed is checked in step S1907. If an unprocessed main field exists in the stripe region, the processing shifts to step S1908 to move the stage 11 in the Y direction in order to expose the next subfield MF, and then returns to step S1901. The above processing is repeated for a subfield belonging to the new main subfield.

If YES in step S1907, the processing advances to step S1909 to check whether exposure processing of all the stripe fields, i.e., the entire exposure field is completed. If an unprocessed stripe field exists, the processing advances to step S1910 to move the stage 11 in the X direction in order to expose the next stripe field, and returns to step S1901. The above processing is repeated for the new stripe field. As described with reference to FIG. 8, the processing order of the main field MF is different between the stripe fields STRIPE1 and STRIPE2. For this reason, movement in the Y direction in step S1908 is opposite between the stripe fields STRIPE1 and STRIPE2.

If YES in step S1909, the processing ends.

As described above, according to the embodiment, the dose can be switched in units of partial fields each smaller than the element exposure field, and scan/exposure is completed for each partial field. Compared to frequently switching the dose, as shown in FIG. 9, the set ring time of the apparatus including the data transfer time can be shortened. That is, as shown in FIGS. 14 and 15, transfer and setting of data (DATA) to each driving circuit DRV suffice to be performed only once for each partial field. After that, drawing in the partial field is done with only dot control data (DOT: expressible by a 1-bit ON/OFF signal). The time required for transfer and setting of data (DATA) to each driving circuit DV can be shortened. Hence, the throughput of exposure processing can be kept high, the dose can be controlled with high precision with respect to the influence of the proximity effect, and the influence of the proximity effect can be effectively excluded.

Note that the above embodiment has been described using a multi-electron beam type exposure apparatus, but the present invention can also be applied to a single-electron beam type exposure apparatus. That is, the multi-electron beam type exposure apparatus simultaneously scans and exposes a plurality of element exposure fields (EF in FIG. 10), whereas the single-electron beam type exposure apparatus scans and exposes one element exposure field at once. Except for this, the scan/exposure sequence described in the above embodiment can be directly applied to the single-electron beam type exposure apparatus.

[Device Manufacturing Method]

An embodiment of a device manufacturing method using the electron beam exposure apparatus 100 according to the above embodiment will be described.

Figure 16:
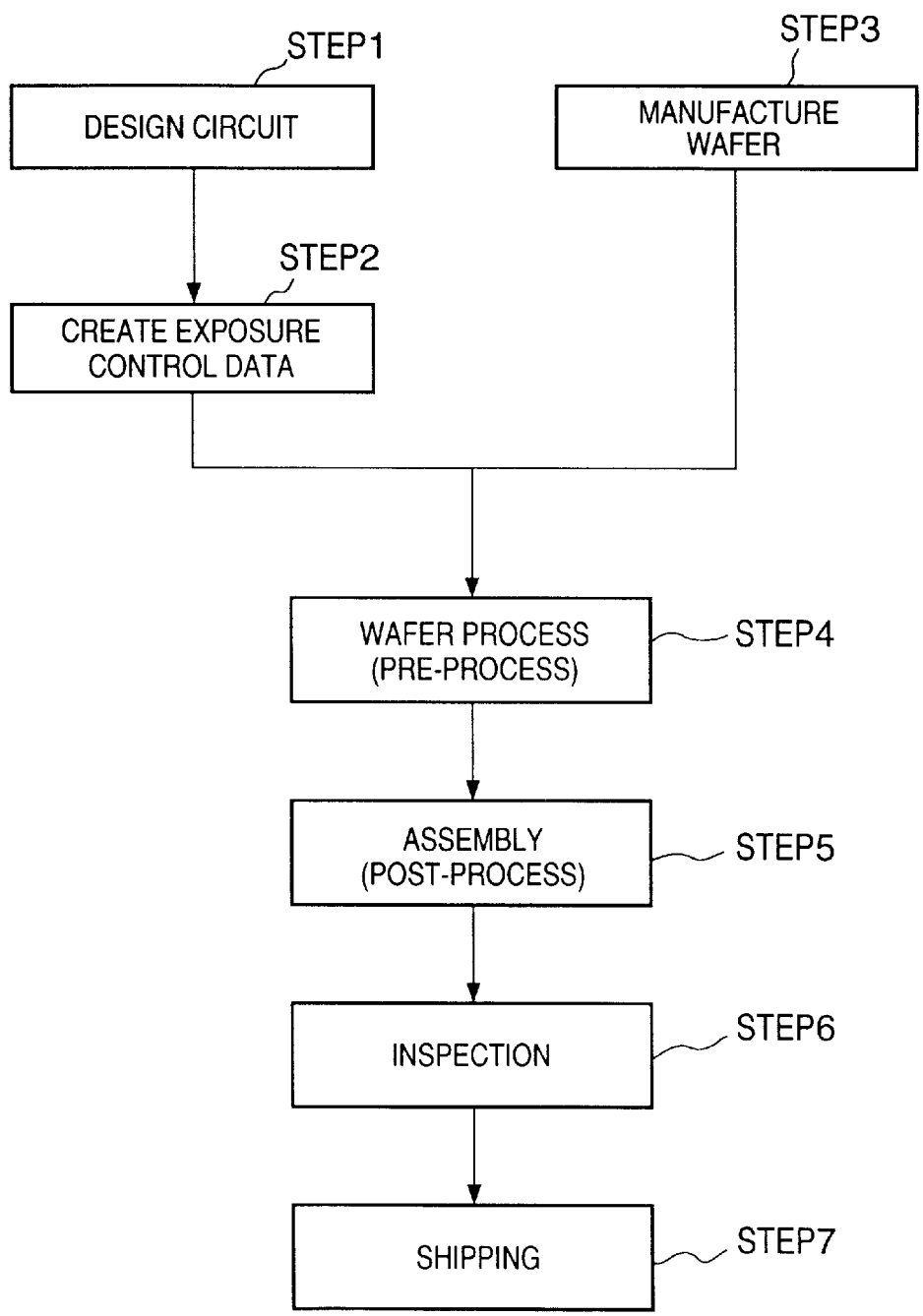
FIG. 16 is a flow chart showing the manufacturing flow of a microdevice (semiconductor chip such as an IC or LSI, liquid crystal panel, CCD, thin-film magnetic head, micromachine, or the like)

FIG. 16 is a flow chart showing the manufacturing flow of a microdevice (semiconductor chip such as an IC or LSI, liquid crystal panel, CCD, thin-film magnetic head, micromachine, or the like). In step 1 (circuit design), a semiconductor device circuit is designed. In step 2 (creation of exposure control data), the information processing apparatus 200 creates exposure control data of the exposure apparatus based on the designed circuit pattern. In step 3 (wafer manufacture), a wafer is manufactured using a material such as silicon. In step 4 (wafer process) called a pre-process, an actual circuit is formed on the wafer by lithography using the electron beam exposure apparatus 100 which has received the exposure control data created in step 2. Step 5 (assembly) called a post-process is the step of forming a semiconductor chip using the wafer manufactured in step 4, and includes an assembly process (dicing and bonding), packaging process (chip encapsulation), and the like. In step 6 (inspection), inspections such as the operation confirmation test and durability test of the semiconductor device manufactured in step 5 are conducted. After these steps, the semiconductor device is completed and shipped (step 7).

Figure 17:
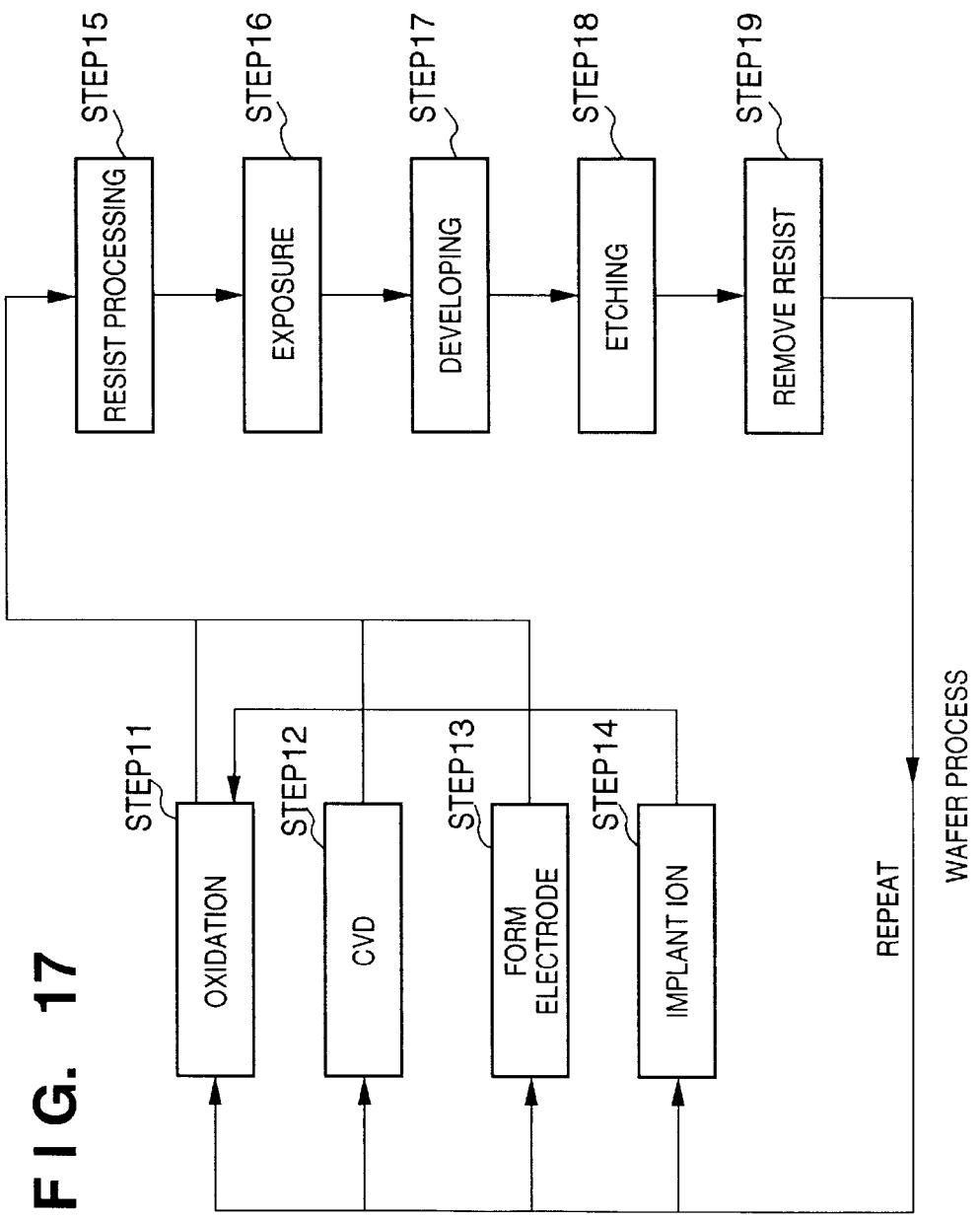
FIG. 17 is a flow chart showing the detailed flow of the wafer process shown in FIG. 16.

FIG. 17 is a flow chart showing the detailed flow of the wafer process shown in FIG. 16. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the electron beam exposure apparatus 100 exposes the wafer to a circuit pattern. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer.

As has been described above, the present invention can effectively exclude an adverse effect caused by the proximity effect while maintaining the throughput of exposure processing, and can accurately draw a fine pattern on a substrate using a charged particle beam.

As many apparently widely different embodiments of the present invention can be made without departing from the spirit and scope thereof, it is to be understood that the invention is not limited to the specific embodiments thereof except as defined in the claims.

What is claimed is:

1. A charged-particle beam exposure apparatus for dividing each element exposure field having a size falling within a range where aberration by an electron optical system is suppressed to not more than a predetermined amount into a plurality of partial fields, and drawing a pattern on a substrate with a charged particle beam on the basis of exposure information in which charged-particle beam dosages for the plurality of partial fields are set, comprising:

scan/exposure means for continuously scanning and exposing an entire corresponding partial field with the dosage contained in the exposure information, thereby drawing a pattern; and execution means for sequentially executing scan/exposure by said scan/exposure means for all partial fields in the element exposure field, thereby drawing a pattern in the element exposure field.

2. The apparatus according to claim 1, wherein a size of the partial region is smaller than a circle having a backward scattering diameter of the charged particle beam on a surface to be exposed on the substrate.

3. The apparatus according to claim 1, wherein said scan/exposure means draws the pattern by raster-sequentially scanning the partial field.

4. The apparatus according to claim 1, wherein said execution means raster-sequentially selects a partial field to be scanned/exposed by said scan/exposure means from the element exposure field.

5. The apparatus according to claim 1, wherein said scan/exposure means draws the pattern by controlling an orbit of a single charged particle beam.

6. The apparatus according to claim 1, wherein
said scan/exposure means draws the pattern by controlling orbits of a plurality of charged particle beams, and
the element exposure fields are set to be fields adjacent between adjacent charged particle beams.

7. An exposure system having a charged-particle beam exposure apparatus for drawing a pattern on a substrate with a charged particle beam on the basis of exposure information, comprising:

determination means for dividing an element exposure field having a size falling within a range where aberration by an electron optical system is suppressed to not more than a predetermined amount into a plurality of partial fields, and determining charged-particle beam dosages for the plurality of partial fields on the basis of a drawing pattern;

providing means for providing the charged-particle beam exposure apparatus with exposure information containing the dosages determined by said determination means and the drawing pattern for the respective partial fields;

scan/exposure means for continuously scanning and exposing an entire corresponding partial field with the dosage contained in the exposure information, thereby drawing a pattern; and execution means for sequentially executing scan/exposure by said scan/exposure means for all partial fields included in the element exposure field, thereby drawing a pattern in the element exposure field.

8. The system according to claim 7, wherein said determination means determines the charged-particle beam dosage in scan/exposure for a partial field of interest so as to exclude influence of a proximity effect on the basis of at least a drawing pattern of the partial field of interest.

9. The system according to claim 7, wherein said determination means determines the charged-particle beam dosage in scan/exposure for a partial field of interest so as to exclude influence of a proximity effect on the basis of drawing patterns of the partial field of interest and peripheral partial fields.

10. The system according to claim 9, wherein the peripheral partial fields are partial fields included in a circular field which is centered on the partial field of interest and has a diameter three times a backward scattering diameter of the charged particle beam.

11. A control method for a charged-particle beam exposure apparatus for dividing each element exposure field having a size falling within a range where aberration by an electron optical system is suppressed to not more than a predetermined amount into a plurality of partial fields, and drawing a pattern on a substrate with a charged particle beam on the basis of exposure information in which charged-particle beam dosages for the plurality of partial fields are set, comprising:

a scan/exposure step of continuously scanning and exposing an entire corresponding partial field with the dosage contained in the exposure information, thereby drawing a pattern; and an execution step of sequentially executing scan/exposure in the scan/exposure step for all partial fields in the element exposure field, thereby drawing a pattern in the element exposure field.

12. The method according to claim 11, wherein a size of the partial region is smaller than a circle having a backward scattering diameter of the charged particle beam on a surface to be exposed on the substrate.

13. A device manufacturing method comprising the step of drawing a pattern on a substrate while controlling a charged-particle beam exposure apparatus by the control method defined in claim 12.

14. The method according to claim 11, wherein the scan/exposure step comprises drawing the pattern by raster-sequentially scanning the partial field.

15. The method according to claim 11, wherein the execution step comprises raster-sequentially selecting a partial field to be scanned/exposed in the scan/exposure step from the element exposure field.

16. The method according to claim 11, wherein the scan/exposure step comprises drawing the pattern by controlling an orbit of a single charged particle beam.

17. The method according to claim 11, wherein
the scan/exposure step comprises drawing the pattern by controlling orbits of a plurality of charged particle beams, and
the element exposure fields are set to be fields adjacent between adjacent charged particle beams.

18. A control method for an exposure system having a charged-particle beam exposure apparatus for drawing a pattern on a substrate with a charged particle beam on the basis of exposure information, comprising:

a determination step of dividing an element exposure field having a size falling within a range where aberration by an electron optical system is suppressed to not more than a predetermined amount into a plurality of partial fields, and determining charged-particle beam dosages for the plurality of partial fields on the basis of a drawing pattern;

a providing step of providing the charged-particle beam exposure apparatus with exposure information containing the dosages determined in the determination step and the drawing pattern for the respective partial fields;

a scan/exposure step of continuously scanning and exposing an entire corresponding partial field with the dosage contained in the exposure information, thereby drawing a pattern; and an execution step of sequentially executing scan/exposure in the scan/exposure step for all partial fields included in the element exposure field, thereby drawing a pattern in the element exposure field.

19. The method according to claim 18, wherein the determination step comprises determining the charged-particle beam dosage in scan/exposure for a partial field of interest so as to exclude influence of a proximity effect on the basis of at least a drawing pattern of the partial field of interest.

20. The method according to claim 18, wherein the determination step comprises determining the charged-particle beam dosage in scan/exposure for a partial field of interest so as to exclude influence of a proximity effect on the basis of drawing patterns of the partial field of interest and peripheral partial fields.

21. The method according to claim 20, wherein the peripheral partial fields are partial fields included in a circular field which is centered on the partial field of interest and has a diameter three times a backward scattering diameter of the charged particle beam.

22. A device manufacturing method using, for part of a process, a charged-particle beam exposure system for dividing an element exposure field having a size falling within a range where aberration by an electron optical system is suppressed to not more than a predetermined amount into a plurality of partial fields, and drawing a pattern on a substrate with a charged particle beam on the basis of exposure information in which charged-particle beam dosages for the plurality of partial fields are set, wherein the charged-particle beam exposure system executes:

a determination step of dividing the element exposure field having the size falling within the range where aberration by the electron optical system is suppressed to not more than the predetermined amount into a plurality of partial fields, and determining the charged-particle beam dosages for the plurality of partial fields on the basis of the drawing pattern;

a scan/exposure step of continuously scanning and exposing an entire corresponding partial field with the dosage contained in the exposure information, thereby drawing a pattern; and a execution step of sequentially executing scan/exposure in the scan/exposure step for all partial fields included in the element exposure field, thereby drawing a pattern in the element exposure field.

* * * * *

UNITED STATES PATENT AND TRADEMARK OFFICE
CERTIFICATE OF CORRECTION

PATENT NO. : 6,515,409 B2
DATED : February 4, 2003
INVENTOR(S) : Masato Muraki et al.

It is certified that error appears in the above-identified patent and that said Letters Patent is hereby corrected as shown below:

Drawings,
FIGURE 12, Sheet 12 of 19, "PERPRESENTATIVE" should read
-- REPRESENTATIVE --.

Column 8,
Line 64, "exposure" should read -- exposure. --.

Column 16,
Line 62, "a" should read -- an --.

Signed and Sealed this

Eleventh Day of November, 2003

JAMES E. ROGAN
*Director of the United States Patent and Trademark Office*